United States Patent [19]

Matsukura et al.

[11] Patent Number: 6,087,194
[45] Date of Patent: Jul. 11, 2000

[54] COMPOSITE UNIT OF OPTICAL SEMICONDUCTOR DEVICE AND SUPPORTING SUBSTRATE AND METHOD FOR MOUNTING OPTICAL SEMICONDUCTOR DEVICE ON SUPPORTING SUBSTRATE

[75] Inventors: Hisao Matsukura; Yasuhiko Kudou; Hajime Hotta; Akio Hirakawa; Masaki Sugawara; Jiro Utsunomiya; Kiyoshi Kurosawa, all of Tokyo, Japan

[73] Assignee: Oki Electric Industry Co., Ltd., Tokyo, Japan

[21] Appl. No.: 08/959,855

[22] Filed: Oct. 29, 1997

[30] Foreign Application Priority Data

| Jan. 20, 1997 | [JP] | Japan | 9-007517 |
| Mar. 11, 1997 | [JP] | Japan | 9-055927 |

[51] Int. Cl.⁷ .................................................. H01L 21/00
[52] U.S. Cl. ................................. 438/25; 438/23; 438/24
[58] Field of Search ................................... 438/25, 24, 23

[56] References Cited

U.S. PATENT DOCUMENTS

| 4,565,314 | 1/1986 | Scholz . |
| 5,219,117 | 6/1993 | Lin . |
| 5,472,914 | 12/1995 | Martin et al. . |
| 5,478,778 | 12/1995 | Sawd . |
| 5,661,086 | 8/1997 | Satima et al. . |

FOREIGN PATENT DOCUMENTS

| 0307591 | 3/1989 | European Pat. Off. . |
| 0 482 940 | 4/1992 | European Pat. Off. . |
| 0 579 438 | 1/1994 | European Pat. Off. . |
| 55088362 | 7/1980 | Japan . |
| 60202947 | 10/1985 | Japan . |
| 0 281 899 | 9/1988 | Japan . |
| 02246130 | 10/1990 | Japan . |
| 05021517 | 1/1993 | Japan . |
| 05218134 | 8/1993 | Japan . |
| 05218135 | 8/1993 | Japan . |
| 07240431 | 9/1995 | Japan . |
| 07307363 | 11/1995 | Japan . |
| 08227894 | 9/1996 | Japan . |

OTHER PUBLICATIONS

"A Surface Mount Type Optical Module for Subscriber Networks", vol. SC–1–12; NEC Corporation, 1995, pp. 331–332.

Kurata et al., "A Surface Mount Type Single–Mode Laser Module Using Passive Alignment", Proceedings of The Electronic Components and Technology Conference, Institute of Electrical and Electronics Engineers, May 1995, pp. 759–765.

*Primary Examiner*—Kevin M. Picardat
*Assistant Examiner*—D. M. Collins
*Attorney, Agent, or Firm*—Venable; Robert J. Frank; Allen Wood

[57] ABSTRACT

Composite units of an optical semiconductor device and a supporting substrate are disclosed, in which the rear surface of the optical semiconductor device is provided with one or more electrode patterns and the top surface of the supporting substrate is provided with one or more electrode patterns. The optical semiconductor device and the supporting substrate are fixed to each other by once melting and solidifying one or more solder bumps which intervene between the one or more electrode patterns provided on the rear surface of the optical semiconductor device and the one or more electrode patterns provided on the top surface of the supporting substrate. A good grade of accuracy in the mutual geometric position of the optical semiconductor device and the supporting substrate is obtained in a horizontal direction due to a phenomenon called "the self alignment results" in this specification, in which a molten metal is inclined to become a ball based on surface tension. Methods for mounting an optical semiconductor device on a supporting substrate with a good grade of accuracy in the mutual geometric position therebetween in the horizontal direction, based on the same technical principle, are also disclosed. To realize the foregoing results, each of the composite units of an optical semiconductor device and supporting substrate in accordance with this invention is given various structures specific to each of them, and each of the methods in accordance with this invention is given various steps or processes specific to each of them.

14 Claims, 31 Drawing Sheets

F I G. 1 5
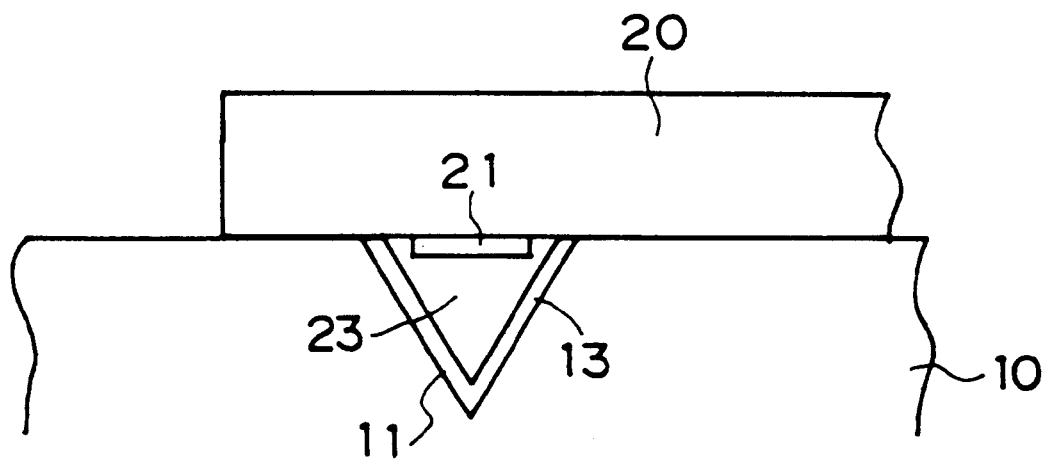
F I G. 1 6
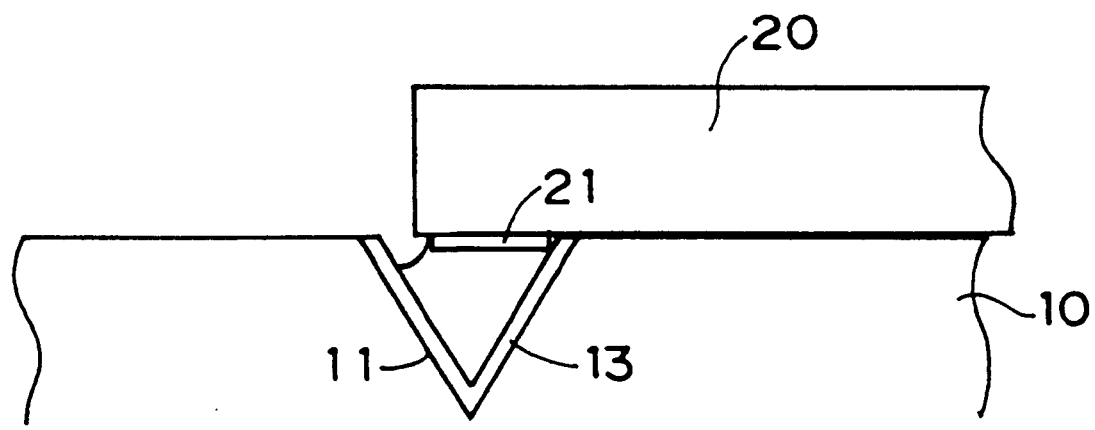

F I G. 5 8
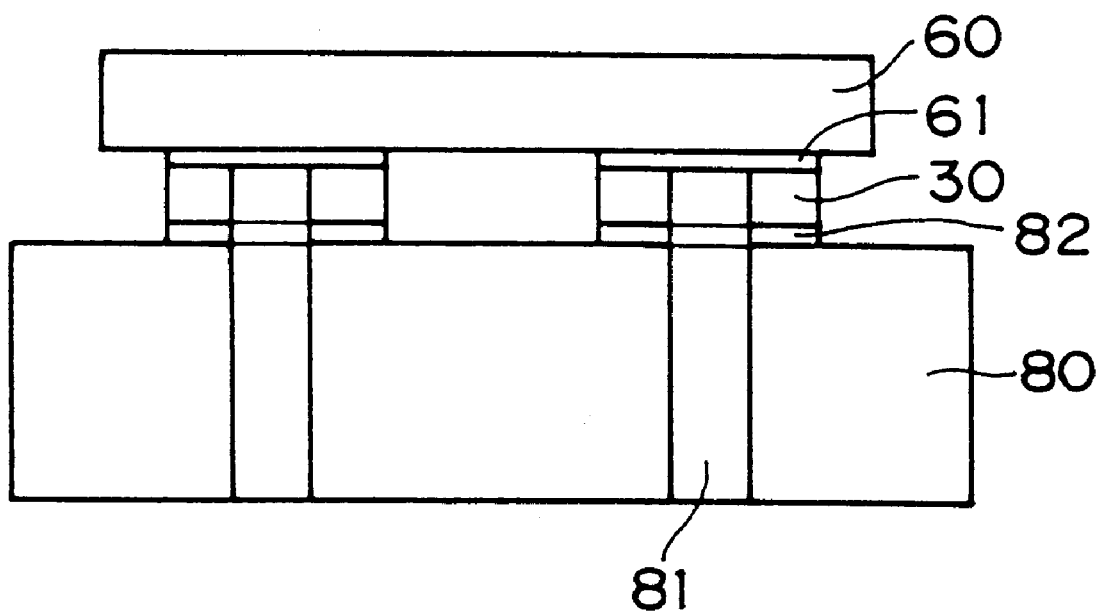

COMPOSITE UNIT OF OPTICAL SEMICONDUCTOR DEVICE AND SUPPORTING SUBSTRATE AND METHOD FOR MOUNTING OPTICAL SEMICONDUCTOR DEVICE ON SUPPORTING SUBSTRATE

BACKGROUND OF THE INVENTION

This invention relates to a variety of improvements applicable to a composite unit of an optical semiconductor device and a supporting substrate and to a variety of improvements applicable to a method for mounting an optical semiconductor device on a supporting substrate.

An optical fiber may be employed to transmit an optical signal emitted by a light emitting diode or a laser diode and/or an optical signal received by a photo diode. Accordingly, connection of an optical fiber and an optical semiconductor device, e.g. a light emitting diode a laser diode or a photo diode, is an important parameter in the technical field of optical signal transmission. In this sense, development of a device employable for coupling or uncoupling an optical fiber and an optical semiconductor device is a long standing subject to enhance the optical signal transmission technology and to cause the optical signal transmission technology to prevail in society.

The requirements for such a device include the function of connecting an optical fiber and an optical semiconductor device in a manner such that the optical axes of both are accurately aligned each other, and the function of allowimg connection and disconnection of an optical fiber and an optical semiconductor device without requiring any skill.

An example of such a device was disclosed in a technical document entitled "Development of a surface mounting optical module" written by Kurata et al. and presented at a convention of the Electronics Society held by Institute of Electronics, Information and Communication Engineers in 1995.

Referring to the drawings, a composite unit of an optical semiconductor device and a supporting substrate disclosed in the document will be described below.

Referring to FIG. 1, a supporting substrate (1) made of an Si plate of which the top surface is covered by an $SiO_2$ film is provided with a pair of marks (1a) as positioning marks, an electrode pattern (1b) produced thereon, and a V-groove (1c) is provided to receive an optical fiber (not shown). A square shown with a broken line shows the location at which an optical semiconductor device which will be described later is scheduled to be placed.

Referring to FIG. 2, an optical semiconductor device (2) having an anode (not shown) produced on the top surface thereof and a cathode (not shown) produced on another surface thereof is provided with a pair of marks (2a) produced on the rear surface thereof as positioning marks at locations corresponding to the foregoing positioning marks (1a) produced on the supporting substrate (1), and an electrode pattern (2b) is produced on the surface of the cathode.

Referring to FIG. 3, the optical semiconductor device (2) is placed on the supporting substrate (1), and Infrared rays are radiated toward the rear surface of the supporting substrate (1) to observe the image of the two pairs of marks (1a) and (2a) on a screen (4) located above the optical semiconductor device (2). The optical semiconductor device (2) is slightly slid along the top surface of the supporting substrate (1) to align the images of the two pairs of marks (1a) and (2a). In this manner, the location of the optical semiconductor device (2) is adjusted on the supporting substrate (1) with an accuracy less than 1 μm, Thereafter, the optical semiconductor device (2) is soldered to the supporting substrate (1) The foregoing composite unit of an optical semiconductor device and a supporting substrate and the method for mounting an optical semiconductor device on a supporting substrate are, however, involved with the drawbacks tabulated below.

1. The process for mounting an optical semiconductor device on a supporting substrate is complicated and requires a sizable amount of time and labor. Particularly, the process for adjusting two marks is troublesome.

2. The accuracy in adjustment of the two pairs of the positioning marks is unsatisfactory, due to irregular reflection of infrared rays caused by roughness of the surfaces of the optical semiconductor device (2) and of the supporting substrate (1).

3. The accuracy in adjustment of the height of the active layer or the optical axis of an optical semiconductor device and the height of the center of the core of an optical fiber is unsatisfactory, because the height of the active layer or the optical axis of an optical semiconductor device inevitably varies depending on the thickness of a layer of solder which fixes the optical semiconductor device and the supporting substrate.

OBJECTS AND SUMMARY OF THE INVENTION

Accordingly, an object of this invention is to provide a variety of composite units of an optical semiconductor device and a supporting substrate, which can readily be assembled with a satisfactory grade of accuracy in all the directions without requiring any particular skill and a significant amount of time and labor.

The other object of this invention is to provide a variety of methods for mounting an optical semiconductor device on a supporting substrate, which methods are allowed to be readily conducted without any particular skill and of which methods the finished accuracy is entirely satisfactory in all the directions.

To achieve the foregoing objects, a variety of composite units of an optical semiconductor device and a supporting substrate and methods for mounting an optical semiconductor device on a supporting substrate in accordance with this invention are based on "the self alignment results", which is a phenomenon observed for a molten metal which intervenes between two plates of a material which has a good grade of wettability with respect to the molten metal, each of the two plates having a limited area.

In other words, when a metal which intervenes between two plates having a limited area is melted, surface tension causes the molten metal to become a ball, resultantly generating a thrust to pull each of the two plates into a mutual position in which the two plates are accurately aligned with each other. A detailed description will be presented for "the self alignment results" later, referring to FIGS. 10 and 11.

"The self alignment results" are utilized to realize a good grade of accuracy in the mutual position of an optical semiconductor device and a supporting substrate in the horizontal direction.

Accuracy in the mutual positioning of an optical semiconductor device and a supporting substrate in the vertical direction is realized by various means specific to each of the embodiments.

Accordingly, a composite unit of an optical semiconductor device and a supporting substrate in accordance with the first embodiment of this invention is a composite unit of an optical semiconductor device and a supporting substrate, wherein the supporting substrate has at least two recesses produced on the top surface thereof and lined by an electrode pattern and a groove produced along the top surface thereof, and the optical semiconductor device has at least two electrode patterns produced on the rear surface thereof at locations corresponding to the electrode patterns produced in the recesses and at least two solder bumps arranged on the electrode patterns produced on the rear surface thereof, and the optical semiconductor device and the supporting substrate are fixed each other by once melting and solidifying the solder bumps, after each of the solder bumps is placed in each of the recesses.

A method for mounting an optical semiconductor device on a supporting substrate in accordance with the first embodiment of this invention is a method for mounting an optical semiconductor device on a supporting substrate comprising a step for placing each of solder bumps arranged on each of electrode patterns produced on the rear surface of the optical semiconductor device in each of recesses produced on the top surface of the supporting substrate, and a step for melting the solder bumps and solidifyig the solder bumps to fix the optical semiconductor device to the supporting substrate.

A method for mounting an optical semiconductor device on a supporting substrate in accordance with the second embodiment of this invention is a method for mounting an optical semiconductor device on a supporting substrate comprising a step for feeding a creamy solder in each of recesses produced on the top surface of the supporting substrate, a step for scraping away the excess volume of the creamy solder, a step for placing each of electrode patterns produced on the rear surface of the optical semiconductor device on the creamy solder fed in the recesses, and a step for melting the creamy solder and solidifying the creamy solder to fix the optical semiconductor device to the supporting substrate.

A method for mounting an optical semiconductor device on a supporting substrate in accordance with the third embodiment of this invention is a method for mounting an optical semiconductor device on a supporting substrate in accordance with the second embodiment of this invention, wherein the location of the electrode patterns deviates from the location of the corresponding ones of the recesses.

A composite unit of an optical semiconductor device and a supporting substrate in accordance with the fourth embodiment of this invention is a composite unit of an optical semiconductor device and a supporting substrate in accordance with the first embodiment of this invention, wherein the at least two grooves are attached by at least one groove extending along the top surface of the supporting substrate.

A composite unit of an optical semiconductor device and a supporting substrate in accordance with the fifth embodiment of this invention is a composite unit of an optical semiconductor device and a supporting substrate, wherein the supporting substrate has at least two recesses and at least one electrode pattern produced on the top surface thereof and a groove produced along the top surface thereof and a mass of a solder arranged on the at least one electrode pattern, and the optical semiconductor device has at least one electrode pattern produced on the rear surface thereof at a location corresponding to the electrode pattern produced in the recess and at least two bumps produced on the rear surface thereof, and the optical semiconductor device and the supporting substrate are fixed each other by once melting and solidifg the solder mass, after each of the bumps is placed on each of the recesses.

A method for mounting an optical semiconductor device on a supporting substrate in accordance with the fifth embodiment of this invention is a method for mounting an optical semiconductor device on a supporting substrate comprising a step for arranging a mass of a solder on each of at least one electrode pattern produced on the top surface of the supporting substrate, a step for placing the optical semiconductor device on the supporting substrate to place each of at least two bumps produced on the rear surface of the optical semiconductor device in each of at least two recesses produced on the top surface of the supporting substrate and to place the at least one electrode pattern produced on the rear surface of the optical semiconductor device on the solder mass, and a step for melting the bumps and solidifying the bumps to fix the optical semiconductor device and the supporting substrate.

A composite unit of an optical semiconductor device and a supporting substrate in accordance with the sixth embodiment of this invention is a composite unit of an optical semiconductor device and a supporting substrate, wherein the supporting substrate has at least three recesses and at least one electrode pattern produced on the top surface thereof and a groove produced along the top surface thereof and a mass of solder arranged on the at least one electrode pattern produced on the top surface thereof, and the optical semiconductor device has at least one electrode pattern produced on the rear surface thereof at locations corresponding to the electrode patterns produced on the top surface of the supporting substrate, further comprising a metal ball arranged in each of the recesses, whereby the optical semiconductor device and the supporting substrate are fixed each other by once melting and solidifying the solder mass, after the optical semiconductor device is placed on the supporting substrate.

A method for mounting an optical semiconductor device on a supporting substrate in accordance with the sixth embodiment of this invention is a method for mounting an optical semiconductor device on a supporting substrate comprising a step for arranging a metal ball in each of at least three recesses produced on the top surface of the supporting substrate, a step for arranging a mass of a solder on each of at least one electrode pattern produced on the top surface of the supporting substrate, a step for placing the optical semiconductor device on the supporting substrate to place at least one electrode pattern on the solder mass, and a step for melting and solidifying the solder mass to fix the optical semiconductor device and the supporting substrate.

A composite unit of an optical semiconductor device and a supporting substrate in accordance with the seventh embodiment of this invention is a composite unit of an optical semiconductor device and a supporting substrate, wherein the supporting substrate has a base and at least one electrode pattern produced on the top surface thereof and a groove produced along the top surface thereof to receive an optical fiber and at least one solder mass arranged on the at least one electrode pattern produced thereon, and the optical semiconductor device has at least one electrode pattern produced on the rear surface thereof at a location corresponding to the at least one electrode pattern produced on the supporting substrate, whereby the optical semiconductor device and the supporting substrate are fixed each other by once melting and solidifying the solder mass, after the optical semiconductor device is placed on the supporting substrate.

A method for mounting an optical semiconductor device on a supporting substrate in accordance with the seventh embodiment of this invention is a method for mounting an optical semiconductor device on a supporting substrate comprising a step for arranging a solder mass on at least one electrode pattern produced on the top surface of the supporting substrate on which a base has been produced, a step for placing the optical semiconductor device on the supporting substrate to place at least one electrode pattern produced on the rear surface of the optical semiconductor device on each of the solder masses, and a step for melting the solder mass and depressing the optical semiconductor device until the rear surface of the optical semiconductor device contacts the top surface of the base and for solidifying the solder mass to fix the optical semiconductor devise and the supporting substrate.

In the seventh embodiment of this invention, the horizontal shape of the base can be a cross.

Further, in the seventh embodiment of this invention, the base can be a piled body of a Ti/Pt/Au layer, an $SiO_2$ layer or an Si layer.

A composite unit of an optical semiconductor device and a supporting substrate in accordance with the eighth embodiment of this invention is a composite unit of an optical semiconductor device and a supporting substrate, wherein the supporting substrate has at least three recesses of which each of the bottom surface is covered by an electrode pattern, an electrode pattern produced on the top surface of the supporting substrate, and a mass of solder arranged on the electrode pattern covering the bottom surface of the recess produced in the supporting substrate, and the optical semiconductor device has at least three electrode patterns produced on the rear surface thereof, whereby the optical semiconductor device and the supporting substrate are fixed each other by once melting and solidifing the solder mass, after the optical semiconductor device is placed on the supporting substrate.

A method for mounting an optical semiconductor device on a supporting substrate in accordance with the eighth embodiment of this invention is a method for mounting an optical semiconductor device on a supporting substrate comprising a step for arranging a solder mass on each of electrode patterns produced in at least three recesses produced in the supporting substrate on which a piled layer of Ti/Pt/Au has been produced, a step for placing the optical semiconductor device on the supporting substrate to place at least three electrode patterns on each of the solder mass, and a step for melting the solder mass and depressing the optical semiconductor device and for solidifying the solder mass to fix the optical semiconductor device and the supporting substrate, after the optical semiconductor device is placed on the supporting substrate.

A composite unit of an optical semiconductor device and a supporting substrate in accordance with the ninth embodiment of this invention is a composite unit of an optical semiconductor device and a supporting substrate, wherein the supporting substrate has a metal base and at least one electrode pattern produced on the top surface thereof, and the optical semiconductor device has at least one electrode pattern produced on the rear surface thereof and at least one bump produced on the electrode pattern produced on the rear surface thereof, whereby the optical semiconductor device and the supporting substrate are fixed each other by once melting and solidifying the bump, after the optical semiconductor device is placed on the supporting substrate.

In the ninth embodiment of this invention, the horizontal shape of the metal base can be a cross.

In the ninth embodiment of this invention, the metal base can be made of a piled layer of Ti/Pt/Au.

A method for mounting an optical semiconductor device on a supporting substrate in accordance with the ninth embodiment of this invention is a method for mounting an optical semiconductor device on a supporting substrate comprising a step for producing a metal base and at least an electrode pattern on the top surface of a supporting substrate, a step for producing at least an electrode pattern on the rear surface of the optical semiconductor device, a step for producing at least one bump on the at least one electrode pattern produced on the rear surface of the optical semiconductor device, and a step for melting the at least one bump and solidjifig the at least one bump to fix the optical semiconductor device and the supporting substrate, after the optical semiconductor device is placed on the supporting substrate.

In the ninth embodiment of this invention, the horizontal shape of the metal base can be a cross.

A composite unit of an optical semiconductor device and a supporting substrate in accordance with the tenth embodiment of this invention is a composite unit of an optical semiconductor device and a supporting substrate in accordance with the ninth embodiment of this invention, wherein the metal base is a copper plate having a horizontal shapes of a rectangle and the number of the electrode patterns produced on the top surface of the supporting substrate and the number of the bumps produced on each of the electrode patterns is at least two.

A method for mounting an optical semiconductor device on a supporting substrate in accordance with the tenth embodiment of this invention is a method for mounting an optical semiconductor device on a supporting substrate comprising a step for placing a rectangular copper plate of which the top and rear surfaces are covered by a solder film and at least two electrode patterns on the top surface of the supporting substrate, a step for producing at least two bumps on each of the two electrode patterns produced on the supporting substrate, and a step for placing each of at least two electrode patterns produced on the rear surface of an optical semiconductor device and one rectangular electrode pattern produced on the rear surface of the optical semiconductor device, respectively on each of the at least two bumps and the rectangular copper plate produced on the supporting substrate, and a step for melting the at least two bumps and solidifying the at least two bumps.

A composite unit of an optical semiconductor device and a supporting substrate in accordance with eleventh embodiment of this invention is a composite unit of an optical semiconductor device and a supporting substrate in accordance with the ninth embodiment of this invention, wherein the metal base is a combination of four metal disks and the number of the electrode patterns produced on the top surface of the supporting substrate and the number of the bumps produced on each of the electrode patterns is four.

A composite unit of an optical semiconductor device and a supporting substrate in accordance with the twelfth embodiment of this invention is a composite unit of an optical semiconductor device and a supporting substrate in accordance with the ninth embodiment of this invention, wherein the metal base is a circle made of a wire lined by a solder the circle made of a wire lined by a solder intervenes between one circular electrode pattern produced on the rear surface of the optical semiconductor device and the other circular electrode pattern produced on the supporting substrate and the number of the electrode patterns produced on the top surface of the supporting substrate and the number of the bumps produced on each of the electrode patterns is four.

A composite unit of an optical semiconductor device and a supporting substrate in accordance with the thirteenth embodiment of this invention is a composite unit of an optical semiconductor device and a supporting substrate in accordance with ninth embodiment of this invention, wherein the metal base is a circle made of a wire lined by a solder, one circular electrode pattern intervenes between the circle made of a wire lined by a solder and the supporting substrate and the number of the electrode patterns produced on the top surface of the supporting substrate and the number of the bumps produced on each of the electrode patterns is four.

A composite unit of an optical semiconductor device and a supporting substrate in accordance with the fourteenth embodiment is a composite unit of an optical semiconductor device and a supporting substrate, wherein the supporting substrate has a circular metal base made of a wire and arranged on the top surface thereof and four electrode patterns produced on the top surface thereof and four bumps produced on the four electrode patterns, and the optical semiconductor device has four electrode patterns produced on the rear surface thereof at locations corresponding to each of the four electrode patterns produced on the top surface of the supporting substrate, whereby the optical semiconductor device and the supporting substrate are fixed each other by once melting and solidifying the bumps, after the optical semiconductor device is placed on the supporting substrate.

A composite unit of an optical semiconductor device and a supporting substrate in accordance with the fifteenth embodiment of this invention is a composite unit of an optical semiconductor device and a supporting substrate wherein the supporting substrate has at least three through-holes penetrating the supporting substrate in the direction perpendicular to the top and rear surfaces thereof, electrode patterns produced to surround each of the top ends of the through-holes and solder bumps placed to cover each of the through-holes, and the optical semiconductor device has at least three electrode patterns produced on the rear surface thereof at locations corresponding to the at least three through-holes, whereby the optical semiconductor device and the supporting substrate are fixed each other by once melting and solidifying the bumps, after the optical semi-conductor device is placed on the supporting substrate.

A method for mounting an optical semiconductor device on a supporting substrate in accordance with the fifteenth embodiment of this invention is a method for mounting an optical semiconductor device on a supporting substrate comprising a step for placing at least three solder bumps to cover each of electrode patterns produced to surround each of the top ends of through-holes produced to penetrate the supporting substrate, a step for drawing the air confined in the through-holes, a step for placing the optical semiconductor device to cover each of the solder bumps with each of electrode patterns produced on the rear surface of the optical semiconductor device, and a step for melting and solidifyig the solder bumps.

A composite unit of an optical semiconductor device and a supporting substrate, in accordance with the sixteenth embodiment of this invention is a composite unit of an optical semiconductor device and a supporting substrate, wherein the supporting substrate has two top surfaces which are separated by a step having a vertical surface and which are parallel to each other, the lower one of the two top surfaces having a recesses extending in the direction perpendicular to the vertical surface of the step and having at least two electrode patterns produced in the recesses and at least two bumps produced on each of the electrode patterns, the higher one of the to surfaces having a groove for receiving an optical fiber, the groove being perpendicular to the vertical surface of the step, and the optical semiconductor device has at least two electrode patterns produced on the rear surface thereof, whereby the optical semiconductor device and the supporting substrate are fixed each other by once melting and solidifying the bumps, after the optical semiconductor device is placed on the supporting substrate.

A method for mounting an optical semiconductor device on a supporting substrate in accordance with the sixteenth embodiment of this invention is a method for mounting an optical semiconductor device on a supporting substrate comprising a step for producing a step separating the top surface of the supporting substrate into two surfaces of which the levels are different from each other and which are parallel to each other, a step for producing a recesses extending along the lower surface in the direction perpendicular to the step, a step for producing at least two electrode patterns on the bottom of the recess, step for producing a bump on each of the electrode patterns, a step for producing a recesses on the higher surface, the recesses being aligned the recesses produced on the lower surface, a step for producing at least two electrode patterns on the rear surface of the optical semiconductor device at locations corresponding to each of the electrode patterns produced on the bottoms of the recess, a step for placing the electrode patterns produced on the rear surface of the optical semiconductor device on the electrode patterns produced in the recesses, a step for urging the optical semiconductor device toward the vertical surface of the step, and a step for one melting and solidifying the bumps.

A composite unit of an optical semiconductor device and a supporting substrate in accordance with the seventeenth embodiment of this invention is a composite unit of an optical semiconductor device and a supporting substrate, wherein the supporting substrate has a rectangular recess which has at least two electrode patterns produced therein and at least two bumps produced on each of the two electrode patterns, two projections arranged thereon along a line perpendicular to the longitudinal side of the recesses, and a groove for receiving an optical fiber, the center line of the groove being aligned the center aligned the recess, and the optical semiconductor device has at least two electrode patterns produced on the rear surface thereof, whereby the optical semiconductor device and the supporting substrate are fixed each other by once melting and solidifying the bumps, after the optical semiconductor device is placed on the supporting substrate.

A method for mounting an optical semiconductor device on a supporting substrate in accordance with the seventeenth embodiment of this invention is a method for mounting an optical semiconductor device on a supporting substrate comprising a step for producing a pair of projections on the top surface of the supporting substrate, a step for producing a rectangular recess extending along the top surface of the supporting substrate in a direction perpendicular to the line connecting the two projections, a step for producing at least two electrode patterns on the bottom of the recess, a step for producing a bump on each of the electrode patterns, a step for producing a recess on the top surface of the supporting substrate, the recess being aligned the rectangular recess, a step for producing at least two electrode patterns on the rear surface of the optical semiconductor device at locations corresponding to each of the electrode patterns produced on the bottom of the rectangular recess, a step for placing the electrode patterns produced on the rear surface of the optical semiconductor device the electrode patterns produced in the recess, a step for urging the optical semiconductor device toward the pair of projections, and a step for once melting and solidifying the bumps.

BRIEF DESCRIPTION OF THE DRAWINGS

This invention, together with its various features and advantages, can be readily understood from the following more detailed description presented in conjunction with the following drawings, in which:

FIG. 15 is a schematic cross section of a composite unit of an optical semiconductor device and a supporting substrate in accordance with the second embodiment of this invention, the cross section being concentrated in the recess and the electrode pattern to be connected the recess and the electrode pattern to be connected the recess, FIG. 16 is a schematic cross section of a composite unit of an optical semiconductor device and a supporting substrate in accordance with the third embodiment of this invention, the cross section being concentrated in the recess to be electrode pattern to be connected the recess and the electrode pattern to be connected the recess, FIG. 58 is schematic cross section of a composite unit of an optical semiconductor device and a supporting substrate in accordance with the fifteenth embodiment of this invention, under progress of production.

DETAILED DESCRIPTION OF THE PREFERRED EMBODIMENTS OF THIS INVENTION

Referring to drawings, composite units of an optical semiconductor device and a supporting substrate in accordance with various embodiments of this invention and methods for mounting an optical semiconductor device on a supporting substrate in accordance with various embodiments of this invention will be described below.

FIRST EMBODIMENT

A composite unit of an optical semiconductor device and supporting substrate, wherein the supporting substrate has at least two recesses produced on the top surface thereof and lined by an electrode pattern made of an Au—Sn alloy layer or a piled layer of Cr/Ni/Au or of Ti/Pt/Au, and the optical semiconductor device has bumps made of an Au—Sn solder having a melting temperature less than the material of the electrode pattern and which bumps are produced at locations corresponding to the foregoing recesses, whereby the optical semiconductor device and the supporting substrate are fixed to each other with a good grade of accuracy by "the self alignment results" in the horizontal direction, which self alignment results are realized by once melting and solidifying the bumps, and by "the surface-to-surface contact" of the optical semiconductor device and the supporting substrate in the vertical direction, will now be described.

Figure 1:
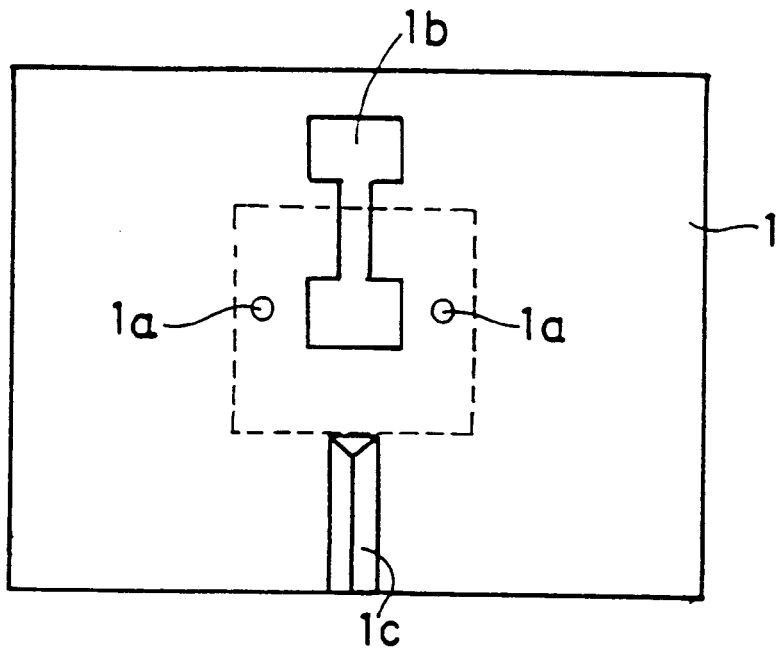
FIG. 1 is a plan view of a supporting substrate of a composite unit of an optical semiconductor device and a supporting substrate available in the prior art.
Figure 2:
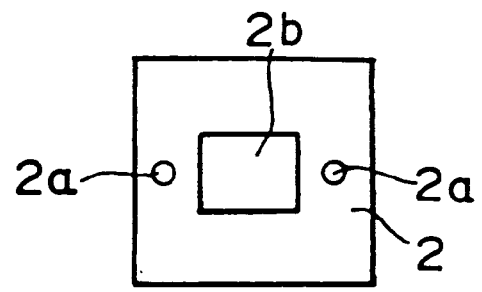
FIG. 2 is a rear view of the optical semiconductor device of the composite unit of an optical semiconductor device and a supporting substrate available in the prior art.
Figure 3:
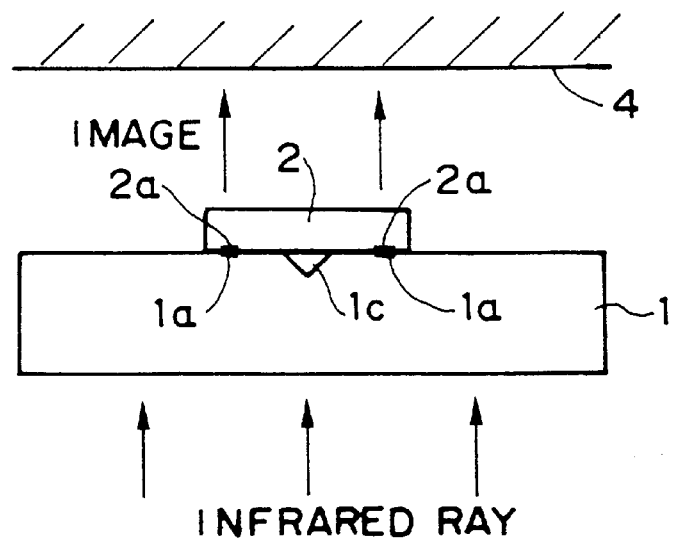
FIG. 3 is a schematic side view of the optical semiconductor device placed on the supporting substrate, in the progress for adjusting the mutual geometrical position between the optical semiconductor device and the supporting substrate.
Figure 4:
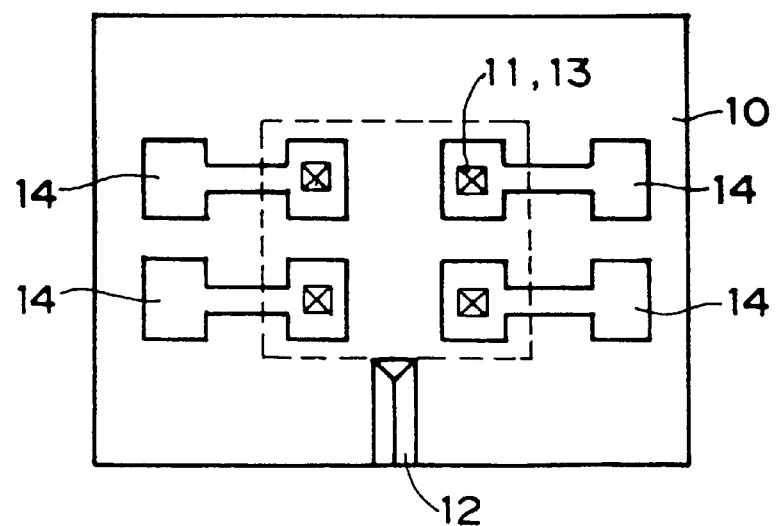
FIG. 4 is a plan view of a supporting substrate composing a composite unit of an optical semiconductor device and a supporting substrate in accordance with the first embodiment of this invention.
Figure 5:
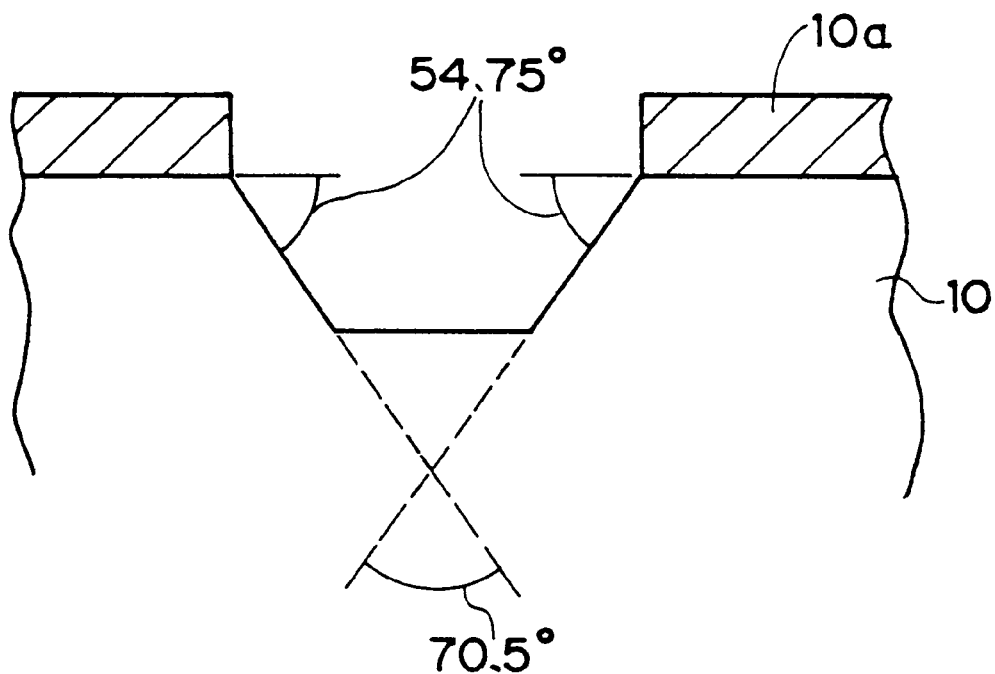
FIG. 5 is a cross section of an Si plate under an etching process conducted employing an etchant containing KOH.
Figure 6:
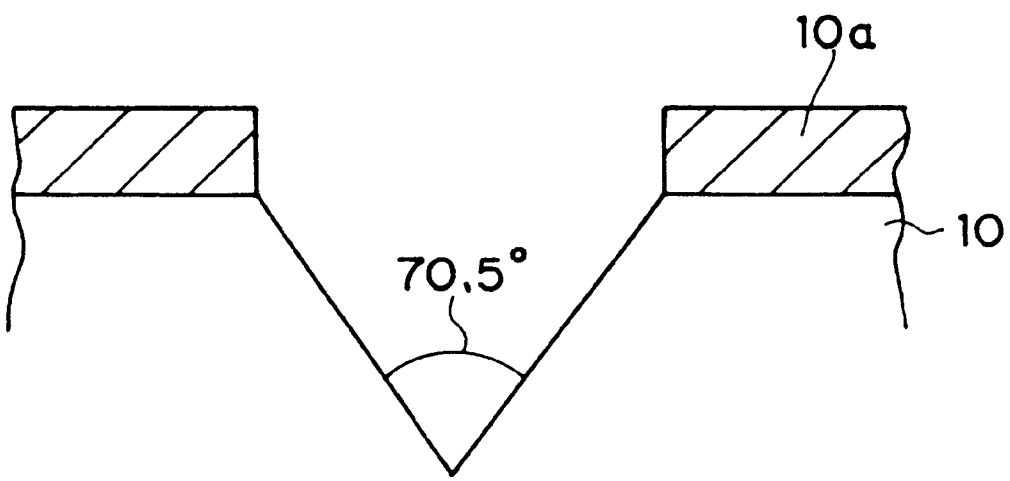
FIG. 6 is a cross section of an Si plate for which an etching process conducted employing an etchant containing KOH is finished.

Referring to FIG. 4, a supporting substrate (10) made of an Si plate of which the top surface is covered by an SiO$_2$ film (not shown) is provided with at least two recesses (four recesses shown in the drawing) (11) and a V-groove (12) horizontally extending along the top surface of the Si plate to receive an optical fiber (not shown). An exemplary thickness of the Si plate is 1.1 mm. The length of the sides of the recesses (11) is selected from the range of 70 through 110 $\mu$m and the depth of the recesses (11) is selected from the range of 50 through 78 $\mu$m. The reason why Si is selected is that an etching process conducted by employing an etchant containing KOH produces a recess of which the bottom angle is precisely 70.5°. Referring to FIG. 5, if the etching process is applied to a limited area of the top surface of an Si plate (10) which remains uncovered by an SiO$_2$ mask (10a), a recess having edge angles of 54.75° begins to be produced. Referring to FIG. 6, the etching process terminates, when a recess having the bottom angle of 70.5° is finished.

Again referring to FIG. 4, since an exemplary horizontal shape of the recesses (11) is a square, the shape of the recesses (11) turns out to be a pyramid. The length of the base of the pyramid can be selected from the range of 70–110 $\mu$m, resulting in the depth varying in the range of 50–78 $\mu$m. The internal surface of each of the recesses (11) is lined by an electrode pattern (13) made of an Au—Sn alloy layer or a piled layer of Cr/Ni/Au or of Ti/Pt/Au, and the electrode patterns (13) extend along the top surface of the Si plate or the supporting substrate (20) to form plural electrodes (14). A square shown in a broken line shows the location at which an optical semiconductor device which will be discussed later is scheduled to be placed.

Figure 7:
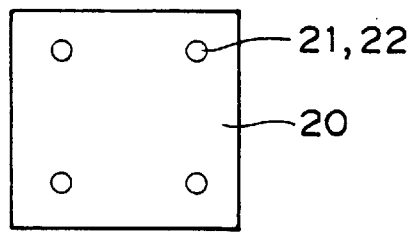
FIG. 7 is a rear view of an optical semiconductor device composing a composite unit of an optical semiconductor device and a supporting substrate in accordance with the first embodiment of this invention.

Referring to FIG. 7, an optical semiconductor device (20), which is a laser diode having an exemplary dimension of 300–350 $\mu$m (sides) and 100 $\mu$m (height) in this example, is provided with electrode patterns (21) each of which has the shape of a circle having a diameter approximately identical to that of a solder bump (22) which will be discussed later. The material of the electrode patterns (22) is an Au—Sn alloy layer or a piled layer of Cr/Ni/Au or of Ti/Pt/Au. The location of the electrode patterns (21) of course corresponds to that of each of the recesses (11) of the supporting substrate (10).

A bump (22) made of an Au-Sn solder is produced on each of the electrode patterns (21). The solder bumps (22) will be once melted and solidified to realize "the self alignment results." The height of the bumps (22) is selected, depending on the depth of the recesses (11) produced in the supporting substrate (10). An exemplary height of the bumps (22) is 75 $\mu$m. Since the electrode patterns (21) and the solder bumps (22) entirely overlap with each other, they can not be illustrated separately in the drawing.

It is well-known that a laser diode has a basic layer configuration in which an active layer or a light emitting layer is arranged between upper and lower reflector layers, which layer configuration is further sandwiched by a current restriction layer (the upper layer) and a substrate (the lower member). The top surface of the basic layer configuration is covered by an upper electrode (usually a p-side electrode) and the bottom surface of the basic layer configuration is covered by a lower electrode (usually an n-side electrode). It is important that the height of the active layer or of the optical axis is identical to that of the core of an optical fiber.

In addition to a laser diode, the optical semiconductor device (20) composing the composite unit of an optical semiconductor device and a supporting substrate in accordance with this invention can be a light emitting diode, a photo diode or the like. In the cases where a light is emitted from the top surface of the diode, the diodes are arranged on the supporting substrate (10) to allow the optical axis to be parallel to the top surface of the diode. In other words, the diode is arranged in a position in which one side thereof is put on a supporting substrate.

A process for mounting an optical device (20), which is a laser diode in this example, on a supporting substrate (20) will be described below.

Figure 8:
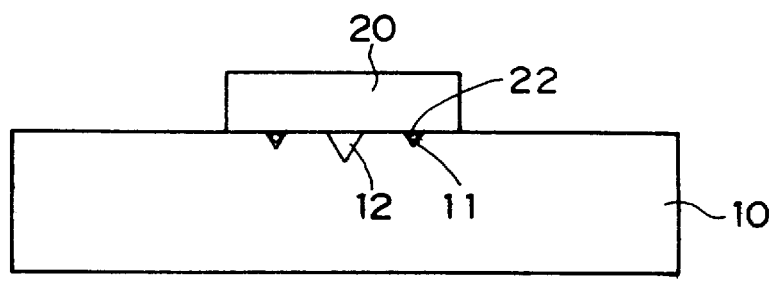
FIG. 8 is a schematic cross section of a composite unit of an optical semiconductor device and a supporting substrate in accordance with the first embodiment of this invention.
Figure 9:
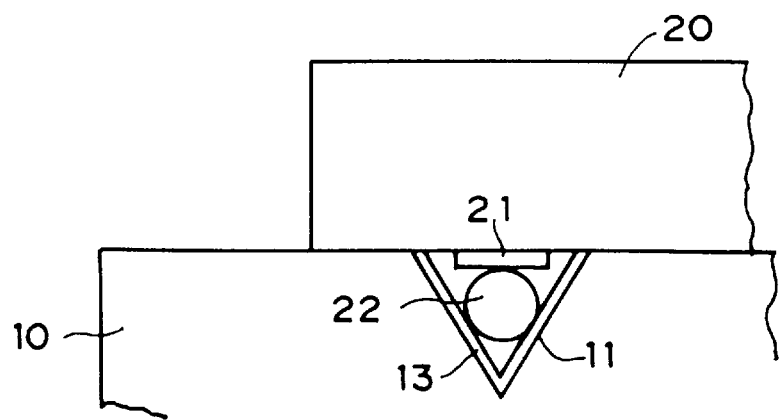
FIG. 9 is an enlarged schematic cross section of a composite unit of an optical semiconductor device and a supporting substrate in accordance with the first embodiment of this invention, the cross section being concentrated in the recess and electrode pattern to be connected a recess.

Referring to FIGS. 8 and 9, some quantity of an Au—Sn solder, containing 80% Au and 20% Sn and having a melting temperature of 280° C., is supplied in each of the recesses (11), which are lined by an Au—Sn alloy layer or a piled layer of Cr/Ni/Au or of Ti/Pt/Au on the electrode pattern (13). The quantity of the Au—Sn solder is selected to be necessary and sufficient to fill the recess (11), when it is melted together with the bump (22). The solder can be supplied into the recesses (11) by employing a vacuum evaporation process, a plating process or a screen printing process.

Automatic chip mounting equipment is employed to place the optical semiconductor device (20) on the supporting substrate (10), and a bumps (22) is inserted in each of the recesses (11). Reflow equipment is employed to heat the supporting substrate (10) to a temperature of e.g. 330° C. At this temperature, the Au—Sn solder is readily melted, but the bumps (22), made of an Au—Sn alloy having a melting temperature higher than that of the Au—Sn solder, is hardly melted.

When the supporting substrate (10) is cooled and the Au—Sn solder is solidified, the optical semiconductor device (20) is fixed on the supporting substrate (10) with a good grade of accuracy in the mutual position therebetween by "the self alignment results" in the horizontal direction and by "the surface-to-surface contact" in the vertical direction. Since the quantity of the Au—Sn solder is selected to be necessary and sufficient to fill each of the recesses (11), the solder does not overflow to devastate the accuracy in the mutual position therebetween in the horizontal direction.

Now, referring to FIGS. 10 and 11, "the self-alignment results" will be described below.

Figure 10:
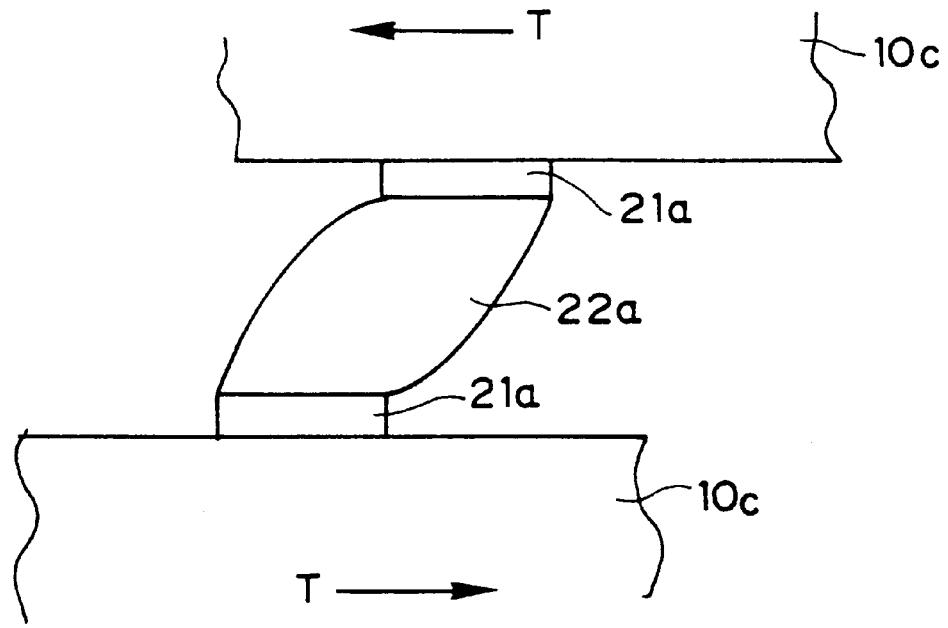
FIG. 10 is a schematic side view illustrating the phenomenon of "the self alignment results"
Figure 11:
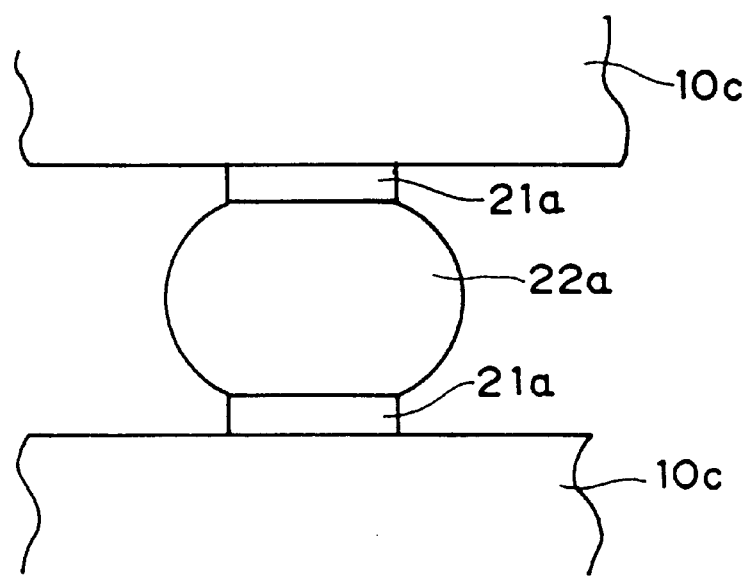
FIG. 11 is a schematic side view illustrating the phenomenon of "the self alignment results"

Supposing a solder bump (22a) which intervenes between a pair of bases (21a) produced of a material having a good magnitude of wettability for solder is melted, the molten solder mass (22a) is inclined to become a ball due to surface tension, resultantly generating thrust illustrated by arrows T in FIG. 10. As a result, the bases (21a) produced on substrates (10c) slide to a position in which the bases (21a) accurately face to each other, as shown in FIG. 11. The accuracy in the mutual geometrical position is approximately 1 $\mu$m or less, while the corresponding accuracy of automatic chip mounting equipment is approximately 10 $\mu$m. This phenomenon is interpreted as "the self alignment results", and a method for aligning two bases (21a) at a position in which the two bases (21a) are accurately aligned with each other by virtue of "the self alignment results" is called a solder bump method and is prevailingly employed in the field of production of semiconductor devices, to fix two parts with a good grade of accuracy in the geometrical mutual position.

Thereafter, the anode, which is the supreme top layer of the optical semiconductor device (20), is connected the positive terminal of a power supply (not shown), and the electrode (14) connected with the cathode of the optical semiconductor device (20) is connected the negative terminal of the power supply (not shown). Further, an optical fiber (not shown) is placed on the V-groove (12) in a manner such that the level of the optical axis of the optical semiconductor device (20) is identical to that of the core of the optical fiber (not shown).

The foregoing description has clarified that the first embodiment of this invention has successfully provided a composite unit of an optical semiconductor device and a supporting substrate, which can readily be assembled, with a satisfactory grade of accuracy of in the mutual position therebetween 1 $\mu$m or less in all the directions without requiring a significant amount of time and labor, and a method for mounting an optical semiconductor device on a supporting substrate, which is easy to conduct and of which the finished accuracy is entirely satisfactory in all the directions.

SECOND EMBODIMENT

A method for mounting an optical semiconductor device having electrode patterns made of an Au—Sn alloy layer or a piled layer of Cr/Ni/Au or of Ti/Pt/Au and which is produced on the rear surface thereof, on a supporting substrate having recesses produced on the top surface thereof and being lined by electrode patterns made of an Au—Sn alloy layer or a piled layer of Cr/Ni/Au or of Ti/Pt/Au by connecting the electrode patterns each other employing a creamy solder, based on "the self alignment results", wherein an excess amount of the creamy solder is scraped away before the mounting step is conducted, will now be described.

Referring to FIG. 4 for the third time, a supporting substrate (10) made of an Si plate of which the top surface is covered by an SiO$_2$ film (not shown) is provided with at least two recesses (four recesses in the drawing) (11) and a V-groove (12) horizontally extending along the top surface of the Si plate to receive an optical fiber (not shown). The internal surface of each of the recesses (11) is lined by an electrode pattern (13) made of an Au—Sn alloy layer or a piled layer of Cr/Ni/Au or of Ti/Pt/Au, and the electrode patterns (13) extend along the top surface of the Si plate or the supporting substrate (20) to form plural electrodes (14). A square shown with a broken line shows the location at which an optical semiconductor device which will be discussed later is scheduled to be placed.

Figure 12:
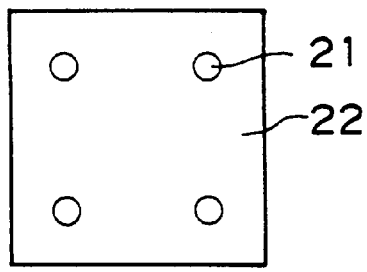
FIG. 12 is a rear view of an optical semiconductor device composing a composite unit of an optical semiconductor device and a supporting substrate in accordance with the first embodiment of this invention.

Referring to FIG. 12, an optical semiconductor device (20), which is again a laser diode in this example, is provided with electrode patterns (21) in a manner similar to that discussed earlier referring to FIG. 7.

Figure 13:
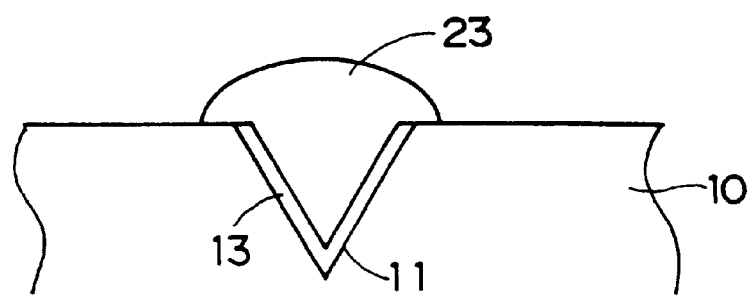
FIG. 13 is a schematic cross section of a supporting substrate composing a composite unit of an optical semiconductor device and a supporting substrate in accordance with the second embodiment of this invention, under progress for feeding a creamy solder.
Figure 14:
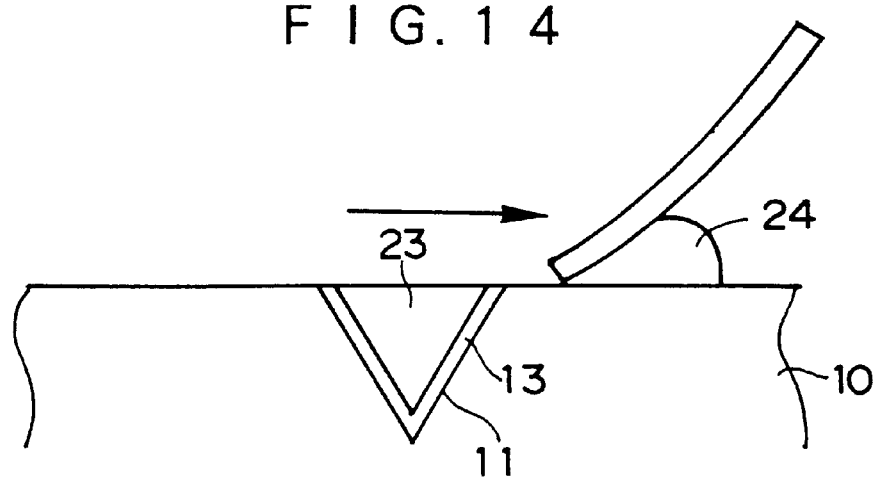
FIG. 14 is a schematic cross section of a supporting substrate composing a composite unit of an optical semiconductor device and a supporting substrate in accordance with the second embodiment of this invention, under progress for scraping away the excess volume of the creamy solder.

Referring to FIGS. 13 and 14, a creamy solder (23) produced by commingling an Au—Si solder powder and a tacky solvent is fed in each of the recesses (11) and the excess volume thereof (24) is scraped away from the top of each of the recesses (11). A screen printing process can be employed to supply the creamy solder (23), and a spatula et cetera can be employed for the scraping process.

Referring to FIG. 15, an automatic chip mounting equipment is employed to place the optical semiconductor device (20) on the supporting substrate (10) in such a manner that the electrode pattern (21) is placed in the recess (11). Reflow equipment is employed to heat the supporting substrate (10) to a temperature of 330° C. and the creamy solder (23) is once melted and solidified.

In this manner, the electrode pattern (21) of the optical semiconductor device (20) is accurately fixed in the recess (11) with an accuracy of 1 $\mu$m or less in the horizontal direction, by virtue of "the self alignment results". In other word, since the surface area of the molten creamy solder 23 becomes smallest, provided the center of the electrode pattern (21) is aligned with the center of the recess (11), the optical semiconductor device (20) slides to the position where the center of the electrode pattern (21) is aligned with the center of the recess (11).

In this manner, an optical semiconductor device can be mounted on a supporting substrate with a good grade of accuracy in the mutual position therebetween to be 1 $\mu$m or less by "the self alignment results", in the horizontal direction and by "the surface-to-surface contact" between the rear surface of the optical semiconductor device and the supporting substrate, in the vertical direction.

THIRD EMBODIMENT

A method for mounting an optical semiconductor device having electrode patterns made of an Au—Sn alloy layer or a piled layer of Cr/Ni/Au or of Ti/Pt/Au and which is produced on the rear surface thereof, on a supporting substrate having recesses produced on the top surface thereof and being lined by electrode patterns made of an Au—Sn alloy layer or a piled layer of Cr/Ni/Au or of Ti/Pt/Au by connecting the electrode patterns each other employing a creamy solder, based on "the self alignment results", wherein the center of each of the electrode patterns made of an Au—Sn alloy layer or a piled layer of Cr/Ni/Au or of Ti/Pt/Au and which is produced on the rear surface of the optical semiconductor device deviates from the center of each of the recesses, whereby versatility is enhanced for the volume of the creamy solder to be fed into the recess, will now be discussed.

Referring to FIG. 4 for the fourth time, a supporting substrate (10) made of an Si plate of which the top surface is covered by an SiO$_2$ film (not shown) is provided with at least two recesses (four recesses in the drawing) (11) and a V-groove (12) horizontally extending along the top surface of the Si plate to receive an optical fiber (not shown). The internal surface of each of the recesses (11) is lined by an electrode pattern (13) made of an Au—Sn alloy layer or a piled layer of Cr/Ni/Au or of Ti/Pt/Au, and the electrode patterns (13) extend along the top surface of the Si plate or the supporting substrate (20) to form plural electrodes (14). A square shown with a broken line shows the location at which an optical semiconductor device which will be discussed later is scheduled to be placed.

Referring again to FIG. 12, an optical semiconductor device (20), which is for the third time a laser diode in this example, is provided with electrode patterns (2 1) in a manner similar to that discussed earlier, referring to FIG. 7. In this embodiment, however, the distance between the electrode patterns (21) differs from that of the recesses (1 1). In other words, each of the electrode patterns (21) partly faces each of the recesses (11). The location of the electrode patterns (21) is selected at the edge of the bottom surface of the optical semiconductor device (20). For example, the distance between the electrode patterns (21) can be selected to be 280 μm, while the distance between the recesses (11) is selected to be 330 μm, making a deviation of 50 μm.

Referring again to FIG. 13, a creamy solder (23) produced by commingling an Au—Si solder powder and a tacky solvent is fed in each of the recesses (11) and the excess volume thereof (24) is scraped away from the top of each of the recesses (11).

Referring to FIG. 16, the optical semiconductor device (20) is placed on the supporting substrate (10). In this embodiment, the recesses (11) are not fully covered by the electrode pattern (21) produced on the rear surface of the optical semiconductor device (20). In other words, a part of the recess (11) remains uncovered by the electrode pattern (21) produced on the rear surfaces of the optical semiconductor device (20). Thus, this space that remains uncovered is allowed to act as a type of a regulating reservoir for the creamy solder. In other words, a deficit in the creamy solder can be compensated, as is illustrated in FIG. 16 and an surplus in the creamy solder can overflow through the open spot remaining at the edge of the optical semiconductor device (20).

In this manner, a large magnitude of versatility is allowed for the volume of the creamy solder to be fed into the recesses (11). A similar grade of accuracy in the mutual geometrical position of the optical semiconductor device and the supporting substrate can be realized.

FOURTH EMBODIMENT

A composite unit of an optical semiconductor device and a supporting substrate, wherein the supporting substrate has at least two recesses attached by at least one V-groove which are produced on the top surface of the supporting substrate and lined by an electrode pattern made of an Au—Sn alloy layer or a piled layer of Cr/Ni/Au or of Ti/Pt/Au, and the optical semiconductor device has at least two electrode patterns produced on the rear surface thereof at locations corresponding to the electrode patterns produced in the recesses and at least two bumps made of an Au—Sn solder at locations corresponding to the foregoing recesses, whereby the optical semiconductor device and the supporting substrate are fixed to each other with a good grade of accuracy of 1 μm or less by "the self alignment results" in the horizontal direction and by "the surface-to-surface contact" in the vertical direction, and an excess volume of a solder can be adjusted by the V-groove accompanying each of the recesses, whereby the accuracy in mutual position of the optical semiconductor device and the supporting substrate is enhanced, will now be discussed.

Figure 17:
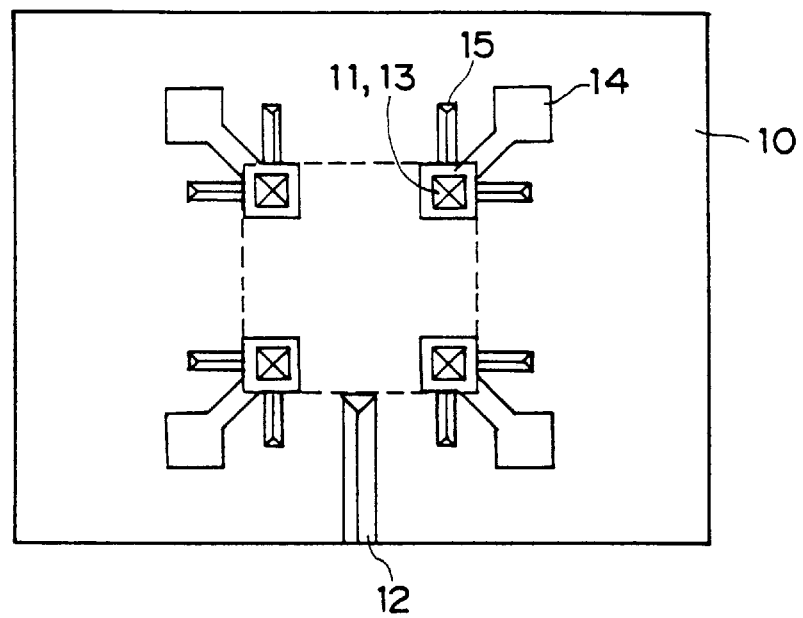
FIG. 17 is a plan view of a supporting substrate composing a composite unit of an optical semiconductor device and a supporting substrate in accordance with the fourth embodiment of this invention.

Referring to FIG. 17, a supporting substrate (10) made of an Si plate of which the top surface is covered by an SiO$_2$ film (not shown), is provided with at least two recesses (four recesses in the drawing) (11) each of which is attached by at least one V-groove (15) (two in the drawing) which is connected the recess (11) and a V-groove (12) horizontally extending along the top surface of the Si plate to receive an optical fiber (not shown). The length of the side of the recesses (11) is selected from the range of 70 through 110 μm and the depth of the recesses (11) is selected from the range of 50 through 78 μm. An exemplary width of the V-groove (15) is 50 μm, and an exemplary length of the V-groove (15) is 100 μm and an exemplary depth of the V-groove (15) is 20 μm, much narrower than the recesses (11).

The internal surface of each of the recesses (11) is lined by an electrode pattern (13) made of an Au—Sn alloy layer or a piled layers of Cr/Ni/Au or of Ti/Pt/Au, and the electrode patterns (13) extend along the top surface of the Si plate or the supporting substrate (20) to form plural electrodes (14). A square shown with a broken line shows the location at which an optical semiconductor device which will be discussed later is scheduled to be placed.

Figure 18:
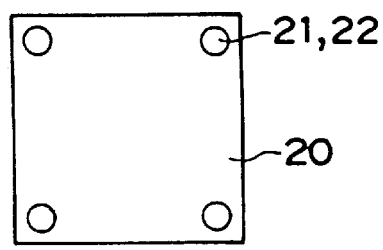
FIG. 18 is a rear view of an optical semiconductor device composing a composite unit of an optical semiconductor device and a supporting substrate in accordance with the fourth embodiment of this invention.

Referring to FIG. 18, an optical semiconductor device (20), which is a laser diode having an exemplary dimension of 300–350 μm (sides) and 100 μm (height) in this example, is provided electrode patterns (21) each of which is a circle made of an Au—Sn alloy layer or a piled layers of Cr/Ni/Au or of Ti/Pt/Au. In this embodiment, the electrode patterns (21) are produced at the edges of the optical semiconductor device (20), resultantly at the corners of the optical semiconductor device (20). A bump (22) made of an Au—Sn solder is produced on each of the electrode patterns (21).

Figure 19:
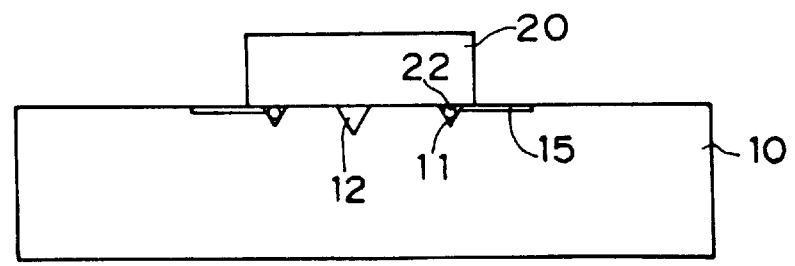
FIG. 19 is a schematic cross section of a composite unit of an optical semiconductor device and a supporting substrate in accordance with the fourth embodiment of this invention.

Referring to FIG. 19, some quantity of an Au—Sn solder is supplied in the recesses (11) attached by the V-grooves (15). After the optical semiconductor device (20) is placed on the supporting substrate (10) in a manner such that the bumps (22) are placed in the recesses (11), a reflow equipment is employed to melt the bumps (22) and to solidify them. By this process, the optical semiconductor device (20) and the supporting substrate (10) are fixed with a satisfactory magnitude of the mutual geometrical accuracy of 1 μm or less by virtue of "the self alignment results" in the horizontal direction.

Figure 20:
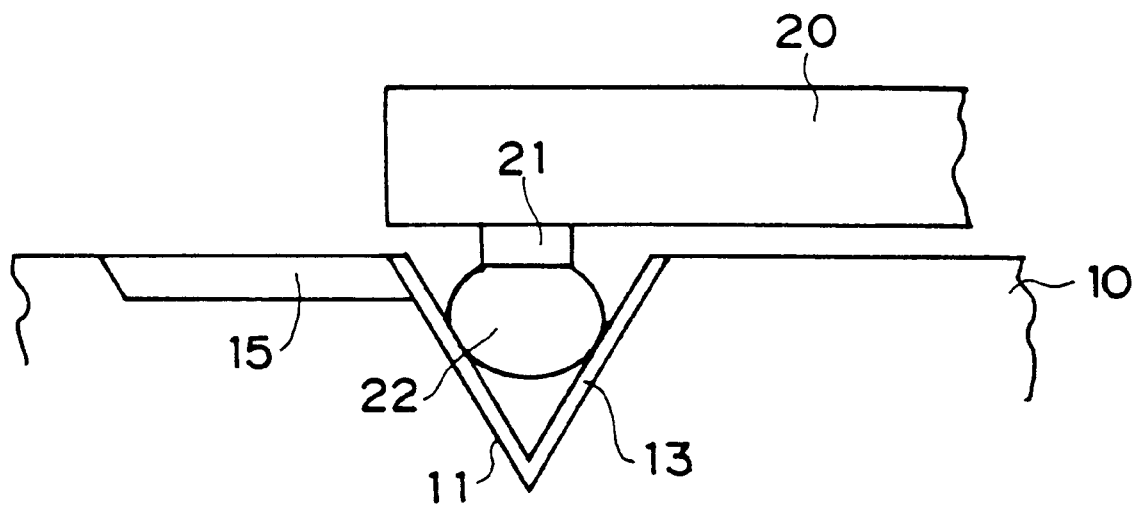
FIG. 20 is an enlarged schematic cross section of a composite unit of an optical semiconductor device and a supporting substrate in accordance with the fourth embodiment of this invention, the cross section illustrating the position before the bumps are melt.

Referring to FIG. 20, if the height of the bumps (22) is larger than expected, a space remains between the rear surface of the optical semiconductor device (20) and the top surface of the supporting substrate (10).

Figure 21:
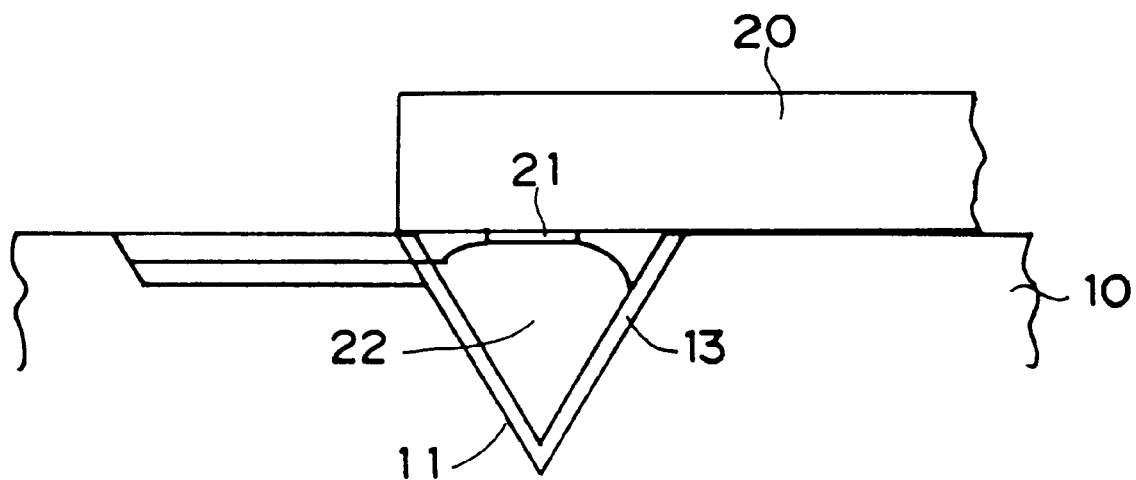
FIG. 21 is enlarged schematic cross section of a composite unit of an optical semiconductor device and a supporting substrate in accordance with the fourth embodiment of this invention, the cross section illustrating the position the bumps are once melt and solidified.

Referring to FIG. 21, however, the bottom surface of the optical semiconductor device (20) directly contacts the top surface of the supporting substrate (10), after the bumps (22) are once melted and solidified. During this melting process, an excess volume of the Au—Sn solder overflows toward the V-groove (15).

Since the rear surface of the optical semiconductor device (20) directly contacts the top surface of the supporting substrate (10), a good accuracy can be realized in the vertical direction, provided the height of the optical axis is properly controlled for the optical semiconductor device (20).

The forgoing description has clarified that the fourth embodiment of this invention has successfully provided a composite unit of an optical semiconductor device and a supporting substrate, which can readily be assembled, with a satisfactory grade of accuracy of 1 μm or less in all the directions without requiring a significant amount of time and labor, and a method for mounting an optical semiconductor device on a supporting substrate, which is easy to conduct and of which the finished accuracy is entirely satisfactory in all the directions. It is noted that the versatility of the volume of a solder to be fed in the recesses is improved.

FIFTH EMBODIMENT

A composite unit of an optical semiconductor device and a supporting substrate, wherein the supporting substrate has at least two recesses and an electrode pattern produced on the top surface thereof, and the optical semiconductor device has at least two bumps made of an Au—Sn solder at locations corresponding to the foregoing recesses and an electrode pattern produced at the location corresponding to the electrode pattern produced on the top surface of the supporting substrate, will now be described.

Figure 22:
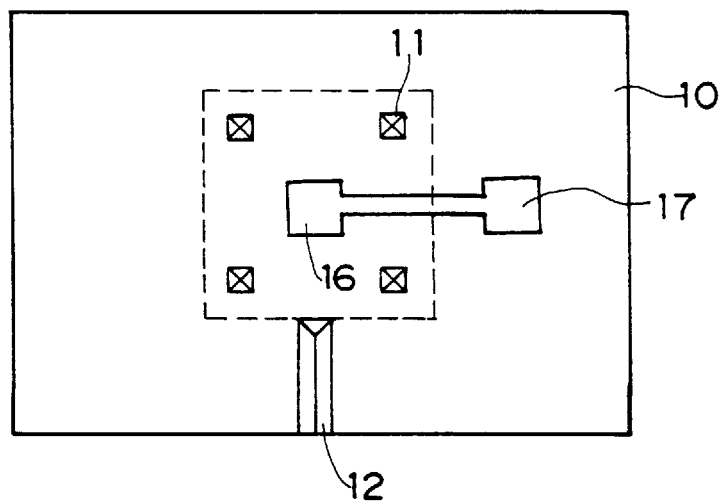
FIG. 22 is a plan view of a supporting substrate composing a composite unit of an optical semiconductor device and a supporting substrate in accordance with the fifth embodiment of this invention.

Referring to FIG. 22, a supporting substrate (10) made of an Si plate of which the top surface is covered by an $SiO_2$ film (not shown) is provided with at least two recesses (four recesses in the drawing) (11) and a V-groove (12) horizontally extending along the top surface of the Si plate to receive an optical fiber (not shown). In addition, a square electrode pattern (16) made of an Au—Sn alloy layer or a piled layer of Cr/Ni/Au or of Ti/Pt/Au is produced on the top surface of the supporting substrate (10) at a location corresponding to the center of an optical semiconductor device (20) which will be discussed later. The electrode pattern (16) extends along the top surface of the supporting substrate (20) to form an electrode (17). A vacuum evaporation process, a metal plating process or a screen printing process can be employed for producing the electrode pattern (16) and the electrode (17).

Figure 23:
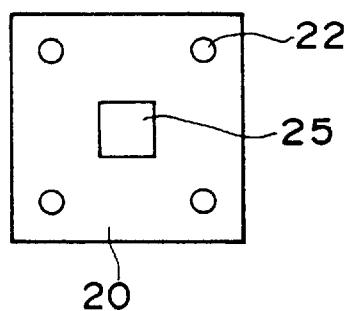
FIG. 23 is a rear view of an optical semiconductor device composing a composite unit of an optical semiconductor device and a supporting substrate in accordance with the fifth embodiment of this invention.

Referring to FIG. 23, an optical semiconductor device (20), which is a laser diode having an exemplary dimension of 300–350 μm (side) and 100 μm (height) in this example, is provided with a square electrode pattern (25) made of an Au—Sn alloy layer or a piled layer of Cr/Ni/Au or of Ti/Pt/Au on the rear surface thereof at a location corresponding to the square electrode (16) produced on the top surface of the supporting substrate (10) and at least two bumps (22) produced on the rear surface thereof at a location corresponding to each of the recesses (11).

Figure 24:
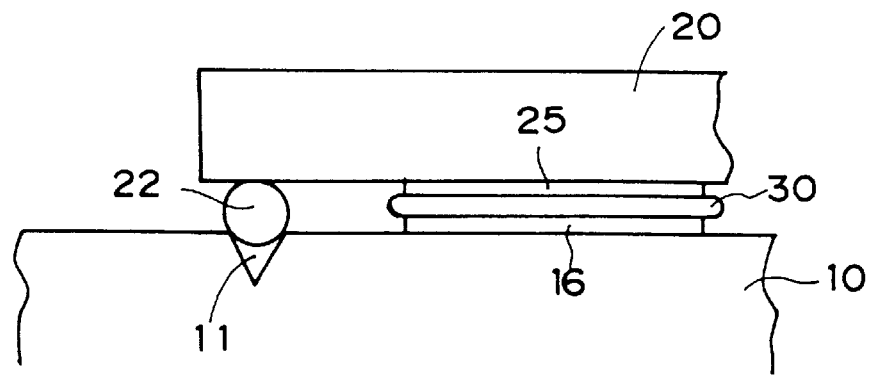
FIG. 24 is a partial view of a schematic cross section of a composite unit of an optical semiconductor device and a supporting substrate in accordance with the fifth embodiment of this invention.

Referring to FIG. 24, after some volume of an Au—Sn solder (30) is fed on the square electrode pattern (16), the optical semiconductor device (20) is placed on the supporting substrate (10) in such a manner to cause the square electrode pattern (25) to contact the Au—Sn solder (30) and to cause the bumps (22) to be put in each of the recesses (11). A reflow process described earlier, referring to FIGS. 8 and 9, is conducted to once melt and solidify the Au—Sn solder (30) and the bumps (22), resultantly realizing the "self alignment results". As a result, a good grade of accuracy of 1 μm or less is realized for the mutual geometrical position of the optical semiconductor device (20) and the supporting substrate (10) in the horizontal direction.

SIXTH EMBODIMENT

A composite unit of an optical semiconductor device and a supporting substrate, wherein the supporting substrate has at least three recesses and at least one electrode pattern produced on the top surface thereof and a mass of an Au—Sn solder arranged on the at least one electrode pattern, and the optical semiconductor device has at least one electrode pattern at a location corresponding to the foregoing electrode pattern of the supporting substrate, and a metal ball is arranged in each of the recesses to determine the vertical distance between the bottom surface of the optical semiconductor device and the top surface of the supporting substrate, and the accuracy in the mutual position between the optical semiconductor device and the supporting substrate is determined by "the self alignment results" realized by a reflow process in which the Au—Sn solder mass is once melted and solidified, will now be described.

Figure 25:
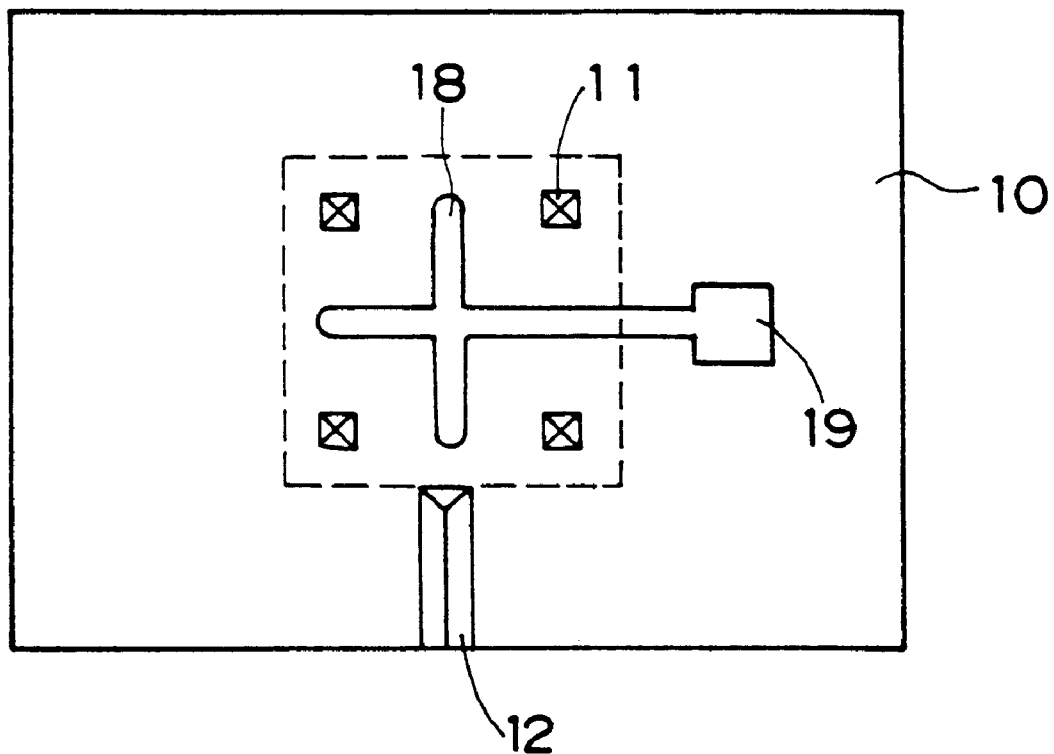
FIG. 25 is a plan view of a supporting substrate composing a composite unit of an optical semiconductor device and a supporting substrate in accordance with the sixth embodiment of this invention.

Referring to FIG. 25, a supporting substrate (10) made of an Si plate of which the top surface is covered by an $SiO_2$ film (not shown) is provided with at least two recesses (four recesses in the drawing) (11) and a V-groove (12) horizontally extending along the top surface of the Si plate to receive an optical fiber (not shown). In addition, at least one (four in the drawings) electrode pattern (18) is produced on the top surface of the supporting substrate (10). The at least one electrode pattern (18) extends along the top surface of the supporting substrate (10) to form an electrode (19). A vacuum evaporation process, a metal plating process or a screen printing process can be employed for producing the electrode pattern (18) and the electrode (19).

Figure 26:
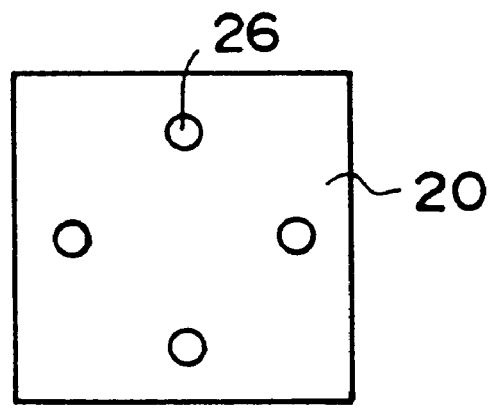
FIG. 26 is a rear view of an optical semiconductor device composing a composite unit of an optical semiconductor device and a supporting substrate in accordance with the sixth embodiment of this invention.

Referring to FIG. 26, an optical semiconductor device (20), which is a laser diode also in this example, is provided with at least one (four in the drawings) electrode pattern (26) on the rear surface thereof.

Figure 27:
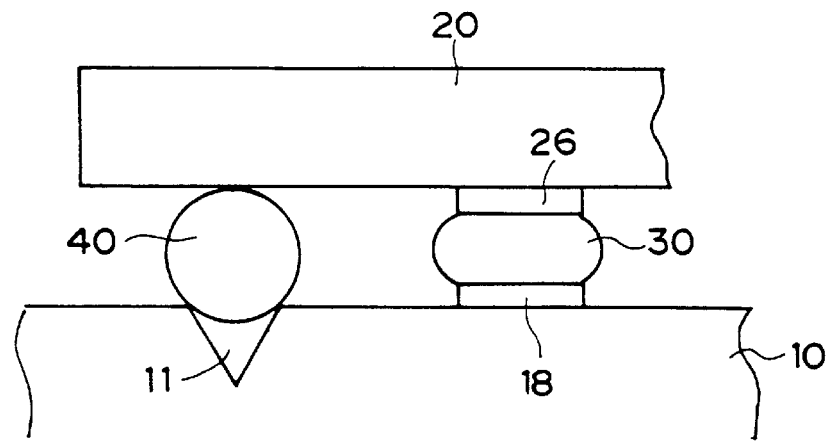
FIG. 27 is a partial view of schematic cross section of a composite unit of an optical semiconductor device and a supporting substrate in accordance with the sixth embodiment of this invention.

Referring to FIG. 27, a vacuum evaporation process, a metal plating process or a screen printing process is employed to feed some quantity of an Au—Sn solder (30) on the electrode pattern (18), and a stainless steel ball (40) having a diameter of 50 through 100 μm is put in each of the recesses (11). The tolerance in the accuracy of the diameter of the stainless steel balls (40) is 0.1 μm. An automatic chip mounting equipment is employed to place the optical semiconductor device (20) on the supporting substrate (10) to cause the two electrode patterns (18) and (26) to face each other. Reflow equipment is employed to once melt and solidify the Au—Sn solder mass (30) for realizing "the self alignment results", which is effective to realize a good magnitude of accuracy for the mutual position of the optical semiconductor device (20) and the supporting substrate (10) in the horizontal direction. Since the dimension of the recesses (11) and the metal balls (40) is extremely accurate, the distance between the rear surface of the optical semiconductor device (20) and the top surface of the supporting substrate (10) is determined accurately, as well.

It is noted in this embodiment that the recesses (11) of the supporting substrate (10) do not function as a conductive path, but as an ingredient to secure a good accuracy of 1 μm or less for the mutual geometrical direction of the optical semiconductor device (20) and the supporting substrate (10). The horizontal accuracy is secured by "the self alignment results" realized by once melting and solidifying the Au—Sn solder mass (30) which intervenes between the two electrode patterns (18) and (26) in the horizontal direction. The accuracy in the vertical direction is realized by the accuracy in the dimension of the metal balls (40).

SEVENTH EMBODIMENT

A composite unit of an optical semiconductor device and a supporting substrate, wherein the supporting substrate is provided a base of which the vertical accuracy is good and which is produced on the top surface thereof and at least one electrode pattern produced on the top surface thereof, the optical semiconductor device is provided at least one electrode pattern produced on the rear surface thereof, and the at least one electrode pattern of the supporting substrate is connected the corresponding ones of the electrode patterns of the optical semiconductor device employing an Au—Sn solder mass, whereby the vertical accuracy is determined by the dimensional accuracy of the foregoing base and the horizontal accuracy is realized by "the self alignment results, will now be described".

Figure 28:
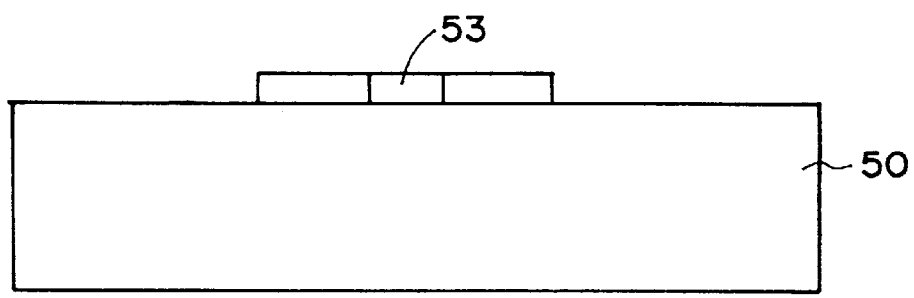
FIG. 28 is a side view of a supporting substrate composing a composite unit of an optical semiconductor device and a supporting substrate in accordance with the seventh embodiment of this invention, under progress of production.

Referring to FIG. 28, an $SiO_2$ film (53) having the horizontal shape of a cross and having the thickness of 100 μm is produced on the top surface of an Si substrate (50) having the thickness of 1.1 mm.

Figure 29:
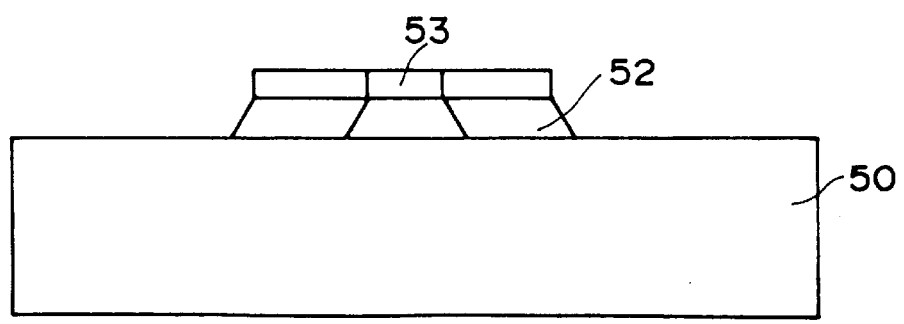
FIG. 29 is a side view of a supporting substrate composing a composite unit of an optical semiconductor device and a supporting substrate in accordance with the seventh embodiment of this invention, under progress of production.

Referring to FIG. 29, an etching process conducted by employing an etchant containing KOH is applied to the Si substrate (50). In this process, the $SiO_2$ film (53) acts as an etching mask. By this process, a base (52) of an Si mesa having the height of 100 μm is produced on the Si substrate (50).

Figure 30:
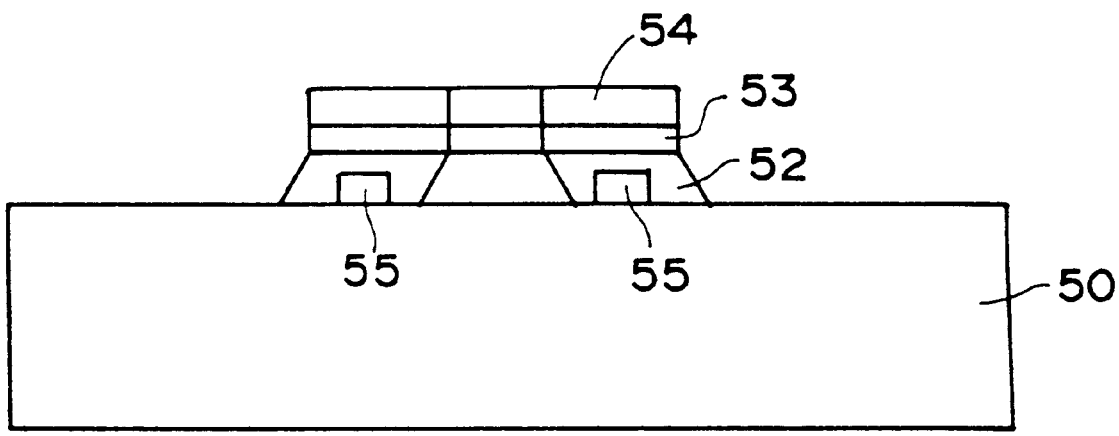
FIG. 30 is a side view of a supporting substrate composing a composite unit of an optical semiconductor device and a supporting substrate in accordance with the seventh embodiment of this invention, under progress of production.

Referring to FIG. 30, a piled layer of Ti/Pt/Au (54) having the thickness of 1 μm is produced selectively on the $SiO_2$ film (53) having the horizontal shape of a cross. A lift off process or a combination of a CVD process and an etching process can be employed for this process.

Figure 35:
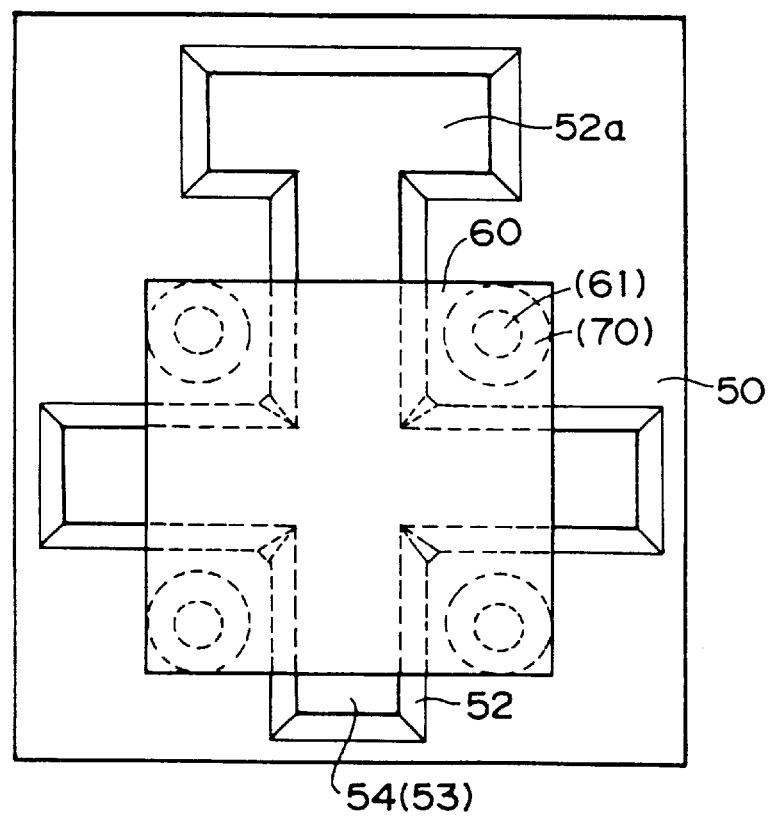
FIG. 35 is plan view of a composite unit of an optical semiconductor device and a supporting substrate in accordance with the seventh embodiment of this invention.

The piled body of the Ti/Pt/Au layer (54), the $SiO_2$ layer (53) and the Si mesa (52) extends on the top surface of the Si substrate (50) to form an electrode (52*a*) (see FIG. 35).

At least three electrode patterns (55) are produced on the top surface of the Si substrate (50).

A V-groove (not shown) is produced to receive an optical fiber to be connected an optical semiconductor device which will be discussed later.

Figure 31:
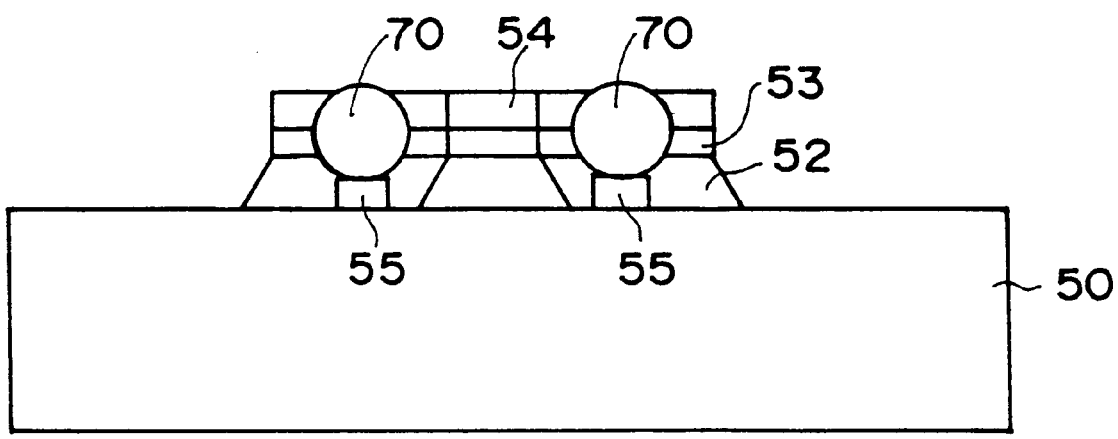
FIG. 31 is a side view of a supporting substrate composing a composite unit of an optical semiconductor device and a supporting substrate in accordance with the seventh embodiment of this invention, under progress of production.

Referring to FIG. 31, a solder ball (70) is placed on each of the electrode patterns (55). A plating process or "a solder ball supply process" can be employed for this process. It is important for this process to make the height of the solder balls (70) higher than the top surface of the piled layer of Ti/Pt/Au (54). For this purpose, the diameter of the solder balls (70) is selected to be e.g. 120 μm.

Figure 32:
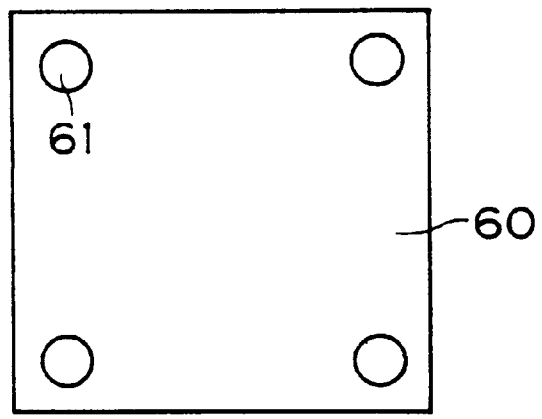
FIG. 32 is a rear view of an optical semiconductor device composing a composite unit of an optical semiconductor device and a supporting substrate in accordance with the seventh embodiment of this invention, under progress of production.

Referring to FIG. 32, at least three electrode patterns (61) are produced on the rear surface of an optical semiconductor device (60).

Figure 33:
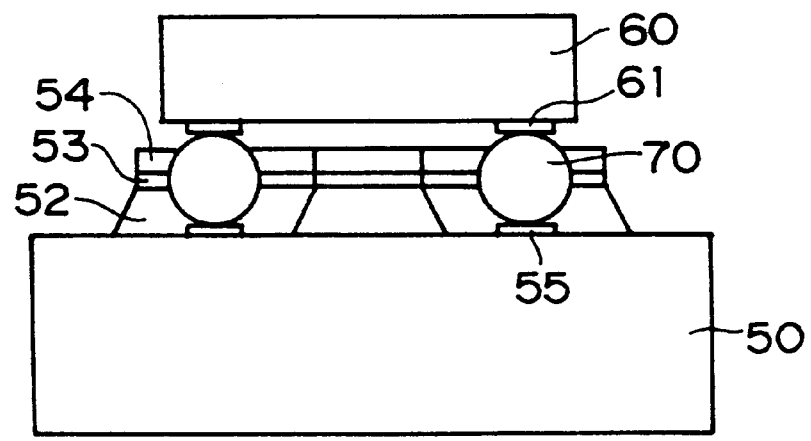
FIG. 33 is side view of a composite unit of an optical semiconductor device and a supporting substrate in accordance with the seventh embodiment of this invention, under progress of production.

Referring to FIG. 33, an automatic chip mounting machine is employed to place the optical semiconductor device (60) on the solder balls (70) in a manner such that each of the electrode patterns (61) contacts one of the solder balls (70) at a position in which the electrode patterns (55) and (61) face to each other.

Figure 34:
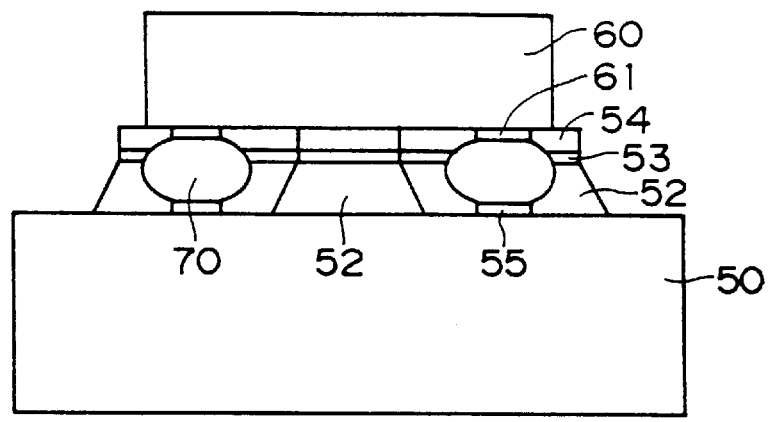
FIG. 34 is side view of a composite unit of an optical semiconductor device and a supporting substrate in accordance with the seventh embodiment of this invention.

Referring to FIGS. 34 and 35, reflow equipment is employed to melt the solder balls (70). Due to "the self alignment results" caused by surface tension of the molten solder ball (70), the optical semiconductor device (60) slides in the horizontal direction to cause the electrode patterns (55) and (61) to accurately be aligned with each other. Thereafter, the temperature of the solder balls (70) is slowly decreased. When the temperature reaches down to 200° C., at which temperature the molten solder balls (70) begin to solidify, the optical semiconductor device (60) is depressed to cause the molten solder balls (70) to be deformed. Since the height of the piled body of the Ti/Pt/Au layer (54), the $SiO_2$ layer (53) and the Si mesa (52) is accurately regulated over the top surface of the Si substrate (50), the height of the optical axis or the active layer of the optical semiconductor device (60) can be made precisely identical to that of the core of an optical fiber which is scheduled to be connected with the optical semiconductor device (60).

Although not shown in the drawings, do not show, the Si substrate (50) is provided with a V-groove produced along the top surface thereof to receive an optical fiber which is scheduled to be connected.

As a result, a good grade of accuracy of 1 μm or less is realized for the mutual geometrical position of the optical semiconductor device (60) and the supporting substrate (50) due to "the self alignment results" in the horizontal direction and due to the precise height of the piled body of the Ti/Pt/Au layer (54), the $SiO_2$ layer (53) and the Si mesa (52) in the vertical direction.

EIGHTH EMBODIMENT

A composite unit of an optical semiconductor device and a supporting substrate, wherein the supporting substrate is provided with at least three recesses in each of which an electrode pattern is produced to receive a solder ball and a piled layer of Ti/Pt/Au produced on the top surface thereof, and the optical semiconductor device is provided with electrode patterns on the rear surface thereof at locations corresponding to the foregoing solder balls arranged on the electrode patterns produced in the recess, whereby the vertical accuracy is determined by the dimensional accuracy of the foregoing base and the horizontal accuracy is realized by "the self alignment results, will now be described".

Figure 36:
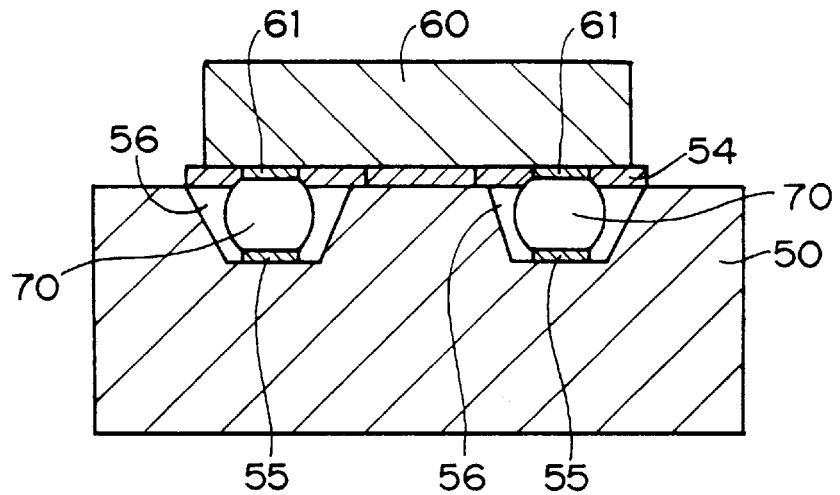
FIG. 36 is a schematic cross section of a composite unit of an optical semiconductor device and a supporting substrate in accordance with the eighth embodiment of this invention.
Figure 37:
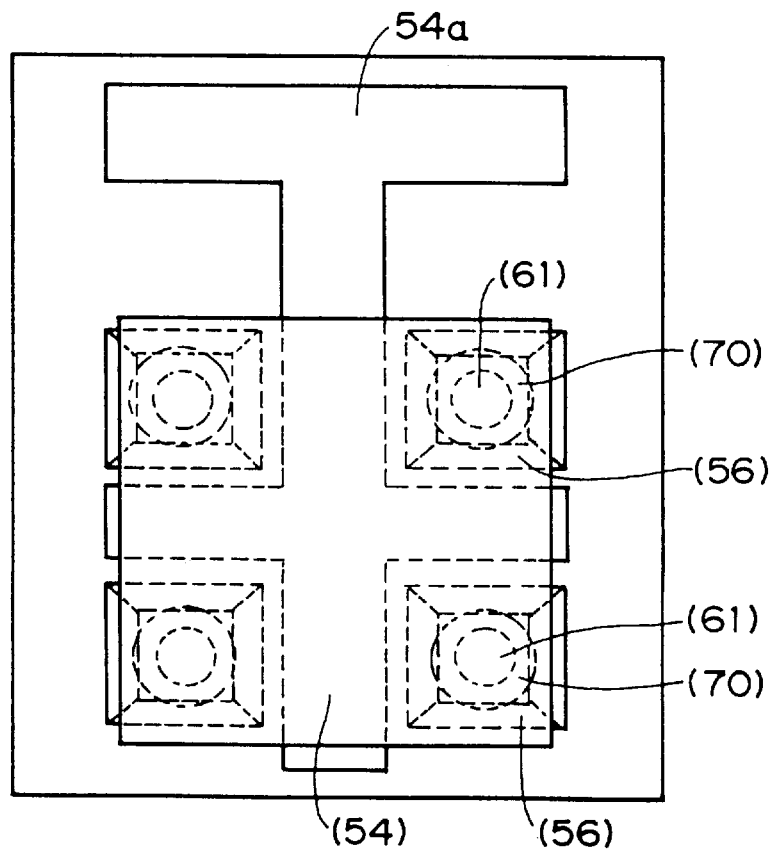
FIG. 37 is a plan view of a composite unit of an optical semiconductor device and a supporting substrate in accordance with the eighth embodiment of this invention.

Referring to FIGS. 36 and 37, at least three (four in the drawings) recesses (56) having the depth of 100 pm are produced in an Si substrate (50). An etching process employing an etchant containing KOH can be employed. An electrode pattern (55) is produced on the bottom of each of the recesses (56) to receive a solder ball (70) thereon. A piled layer of Ti/Pt/Au (54) having the horizontal shape of a cross is produced on the top surface of the Si substrate (50). The piled layer of Ti/Pt/Au (54) extends along the top surface of the Si substrate (50) to form an electrode (54*a*).

At least three (four in the drawings) electrode patterns (61) are produced on the rear surface of an optical semiconductor device (60).

A solder ball (70) is placed on each of the electrode patterns (55). A plating process or "a solder ball supply process" can be employed for this process. It is important for this process to make the height of the solder balls (70) higher than the top surface of the piled layer of Ti/Pt/Au (54).

An automatic chip mounting machine is employed to place the electrode patterns (61) produced on the rear surface of the optical semiconductor device (60) on the solder balls (70) placed in each of the recesses (56), in a manner such that the electrode patterns (61) contact the solder balls (70). Reflow equipment is employed to melt the solder balls (70). Due to "the self alignment results" caused by surface tension of the molten solder ball (70), the optical semiconductor device (60) slides in the horizontal direction to cause the electrode patterns (55) and (61) to accurately be aligned with each other. Thereafter, the temperature of the solder balls (70) is slowly decreased. When the temperature reaches down to 200° C., at which temperature the molten solder balls (70) begin to solidify, the optical semiconductor device (60) is depressed to cause the molten solder balls (70) to be deformed. Since the height of the piled body of the Ti/Pt/Au layer (54), the $SiO_2$ layer (53) and the Si mesa (52) is accurately regulated over the top surface of the Si substrate (50), the height of the optical axis or the active layer of the optical semiconductor device (60) can be made precisely identical to that of the core of an optical fiber which is scheduled to be connected with the optical semiconductor device (60).

Although not shown in the drawings, do not show, the Si substrate (50) is provided with a V-groove produced along the top surface thereof receive an optical fiber which is scheduled to be connected.

NINTH EMBODIMENT

A composite unit of an optical semiconductor device and a supporting substrate, wherein the supporting substrate is provided with a cross-shaped metal base of which the vertical accuracy is good and which is produced on the top surface thereof, and at least one electrode pattern produced on the top surface thereof, and the optical semiconductor device is provided with at least one electrode pattern on the rear surface thereof, and the at least one electrode pattern produced on the top surface of the supporting substrate is connected the corresponding electrode pattern produced on the rear surface of the optical semiconductor device employing an Au—Sn solder bump produced by employing "a solder bump method", whereby the vertical accuracy is realized by the dimensional accuracy of the foregoing base and the horizontal accuracy is realized by "the self alignment results, will now be described".

Figure 38:
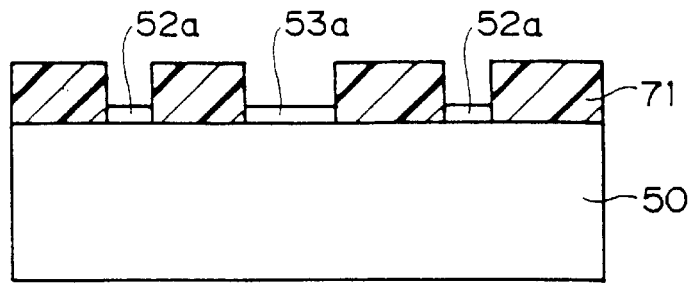
FIG. 38 is a schematic side view of a supporting substrate composing a composite unit of an optical semiconductor device and a supporting substrate in accordance with the ninth embodiment of this invention, under progress of production.

Referring to FIG. 38, a piled layer of Ti/Pt (53a) having the thickness of 0.1 μm and having the horizontal shape of a cross (in the drawing, a cross section of the cross is shown as a small rectangle which intervenes between the other rectangles, 52a) is produced on an Si substrate (50) having the approximate thickness of 1 mm. Simultaneously, at least one piled layer of Ti/Pt (52a) having the thickness of 0.1 μm is produced on the Si substrate (50). The remaining part of the Si substrate (50) is covered by a photo resist layer (71) having the thickness of 120 μm.

Figure 39:
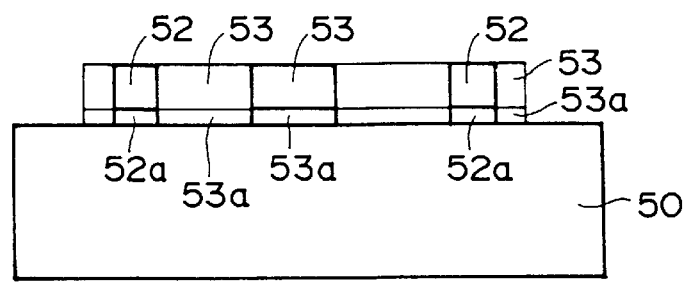
FIG. 39 is a schematic side view of a supporting substrate composing a composite unit of an optical semiconductor device and a supporting substrate in accordance with the ninth embodiment of this invention, under progress of production.

Referring to FIG. 39, a plating process is conducted to produce an Au layer on the Si substrate (50). After removing the photo resist layer (71), the Au layer is polished down to produce a metal base (53) made of Au and which has the horizontal shape of a cross and has the thickness of e.g. 100 μm and at least one (two in the drawing) Au electrode pattern (52) having the thickness of e.g. 100 μm.

Figure 40:
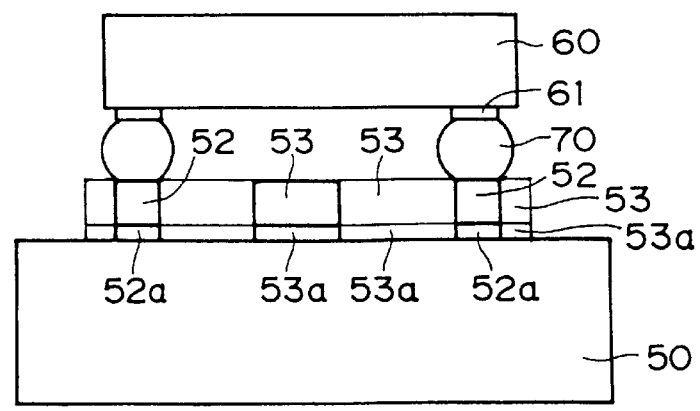
FIG. 40 is a schematic side view of a supporting substrate composing a composite unit of an optical semiconductor device and a supporting substrate in accordance with the ninth embodiment of this invention, under progress of production.

Referring to FIG. 40, after at least one (two in the drawing) electrode pattern (61) is produced on the rear surface of an optical semiconductor device (a laser diode in this embodiment) (60), solder bumps (70) made of an Au—Sn solder containing more Sn than the ordinary Au—Sn solder are produced on the electrode patterns (61). An automatic chip mounting machine is employed to place the optical semiconductor device (60) on the supporting substrate (50) in a manner that the solder bumps (70) are allowed to intervene between the electrode patterns (52) and (61).

Figure 41:
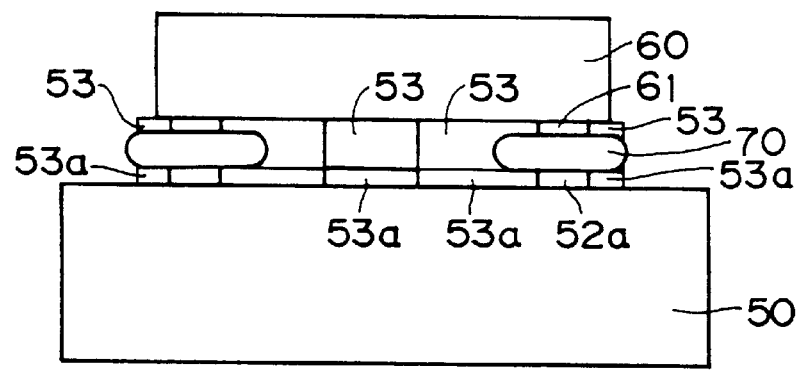
FIG. 41 is a schematic side view of a composite unit of an optical semiconductor device and a supporting substrate in accordance with the ninth embodiment of this invention.
Figure 42:
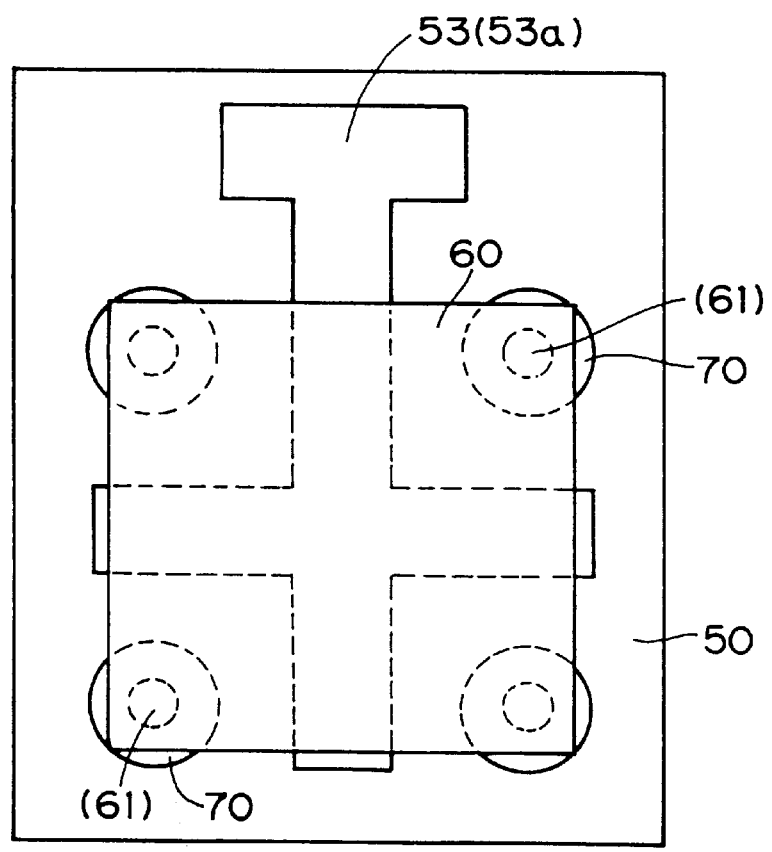
FIG. 42 is plan view of a composite unit of an optical semiconductor device and a supporting substrate in accordance with the ninth embodiment of this invention.

Referring to FIGS. 41 and 42, reflow equipment is employed to melt the solder bumps (70). During this process, the Au electrode patterns (52) are alloyed with the solder bumps (70) to produce an Au—Sn solder containing Au and Sn at a ratio of 8:2. As a result, "the self alignment results" is realized to slide the optical semiconductor device (60) in the horizontal direction to cause the electrode patterns (52a) and (61) to accurately be aligned each other in the horizontal direction.

The temperature is gradually decreased, and the optical semiconductor device (60) is depressed down, when the temperature reaches down to approximately 200° C. Since the height of the cross-shaped bases (53) and (53a) are accurately controlled, the height of the optical axis of the optical semiconductor device (60) is made precisely identical to that of an optical fiber to be connected to the optical semiconductor device. The cross-shaped bases (53) and (53a) are extended along the top surface of the Si supporting substrate (50) to form an electrode.

Although not shown in the drawings do not show, the Si substrate (50) is provided with a V-groove produced thereon to receive an optical fiber.

As a result, a good grade of accuracy of 1 μm or less is realized for the mutual geometrical position of the optical semiconductor device (60) and the supporting substrate (50) due to "the self alignment results" in the horizontal direction and due to the precise height of the metal base (53) and (53a) in the vertical direction.

TENTH EMBODIMENT

A composite unit of an optical semiconductor device and a supporting substrate, wherein the supporting substrate is provided with a rectangular copper base of which the vertical accuracy is good and which is produced on the top surface thereof and at least two electrode patterns produced on the top surface thereof and at least two Au—Sn solder bumps produced on the at least two electrode patterns produced thereon, and the optical semiconductor device is provided with at least two electrode patterns on the rear surface thereof, and the electrode patterns produced on the supporting substrate are connected to the corresponding electrode patterns produced on the optical semiconductor device employing Au—Sn solder bumps produced on the electrode patterns by employing "a solder bump method", whereby the vertical accuracy is realized by the dimensional accuracy of the foregoing copper base and the horizontal accuracy is realized by "the self alignment results, will now be described".

Figure 43:
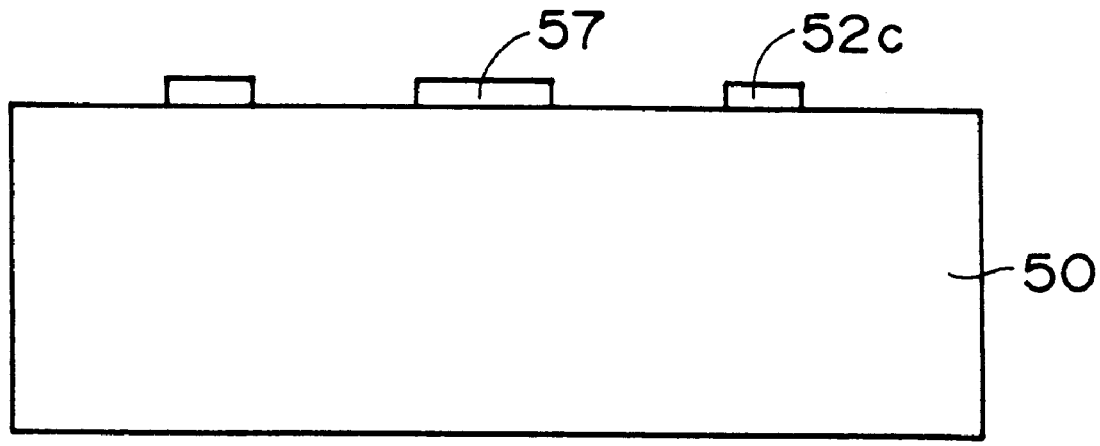
FIG. 43 is a schematic side view of a supporting substrate composing a composite unit of an optical semiconductor device and a supporting substrate in accordance with the tenth embodiment of this invention, under progress of production.
Figure 44:
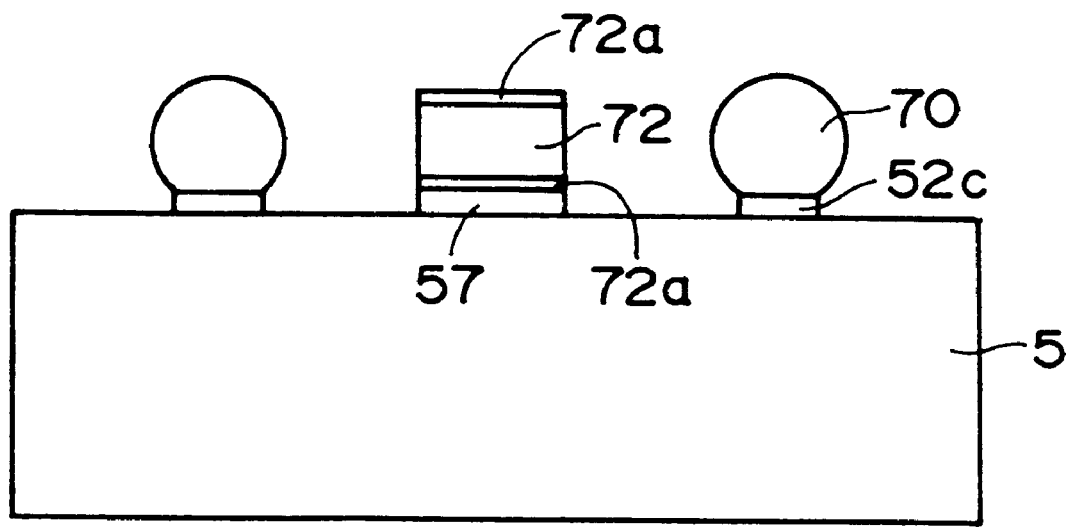
FIG. 44 is a schematic side view of a supporting substrate composing a composite unit of an optical semiconductor device and a supporting substrate in accordance with the tenth embodiment of this invention, under progress of production.

Referring to FIG. 43, a spacer (57) having a rectangular shape and at least one electrode pattern (52c) made of a piled layer of Ti/Pt/Au or of Cr/Ni/Au or a layer of Au—Sn alloy is produced on an Si substrate (50) having the thickness of 1mm. An exemplary thickness of the spacer (57) and the electrode patterns (52c) is 1 μm. Referring to FIG. 44, an Au—Sn solder bump (70) is produced on each of the electrode patterns (52c). An exemplary height of the Au—Sn solder bumps (70) is 120 μm. "A solder bump method" can be employed to produce the Au—Sn solder bumps (70). Automatic chip mounting equipment is employed to place a rectangular base (72) on the spacer (57). The rectangular base (72) is a plate of a metal e.g. Cu having the length of e.g. 350 μm (a length nearly identical to the corresponding length of the optical semiconductor device (50)), the width of e.g. 200 μm and the thickness of e.g. 100 μm, and both upper and lower sides thereof are lined by a solder layer (72a) produced by a plating process or the like to have a thickness of 0.5–1 μm.

Figure 45:
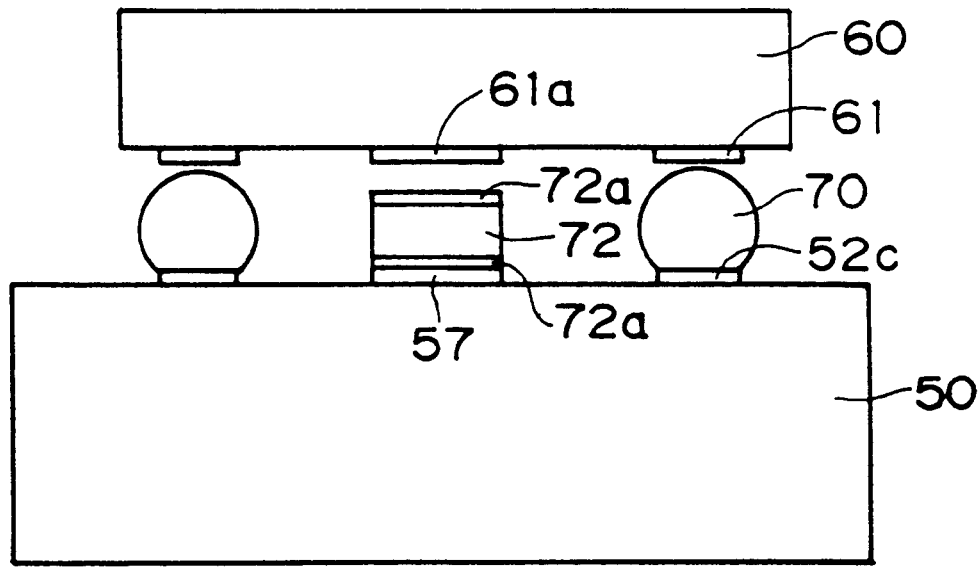
FIG. 45 is a schematic side view of a composite unit of an optical semiconductor device and a supporting substrate in accordance with the tenth embodiment of this invention, under progress of production.

Referring to FIG. 45, automatic chip mounting equipment is employed to place the optical semiconductor device (60) of which the rear surface is provided with electrode patterns (61) and a rectangular spacer (61a), on the supporting substrate (50) in a manner such that the solder bumps (70) are allowed to intervene between the electrode patterns (52c) and (61). The electrode patterns (61) and the rectangular spacer (61a) are made of a piled layer of Ti/Pt/Au or of Cr/Ni/Au or a layer of Au—Sn alloy.

Figure 46:
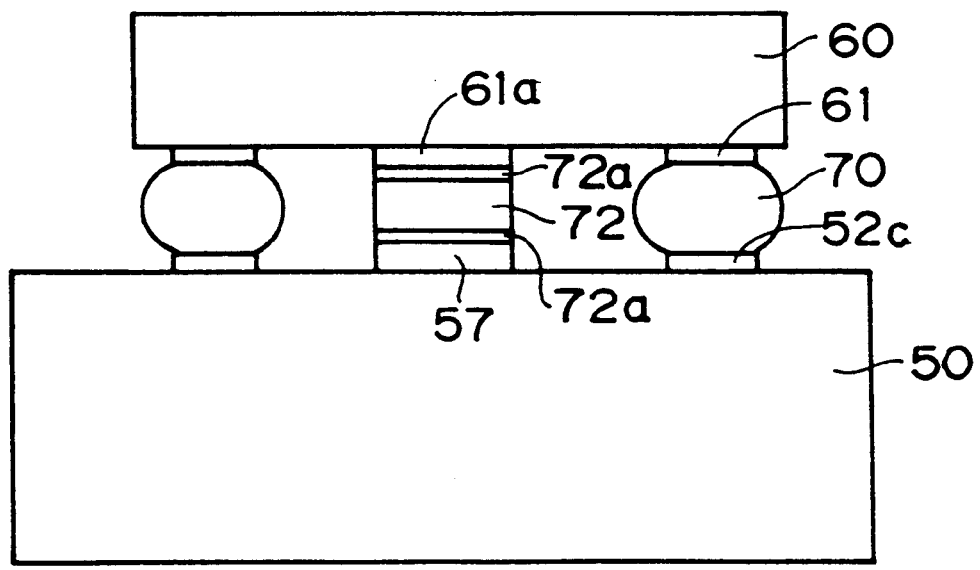
FIG. 46 is a schematic side view of a composite unit of an optical semiconductor device and a supporting substrate in accordance with the tenth embodiment of this invention.
Figure 47:
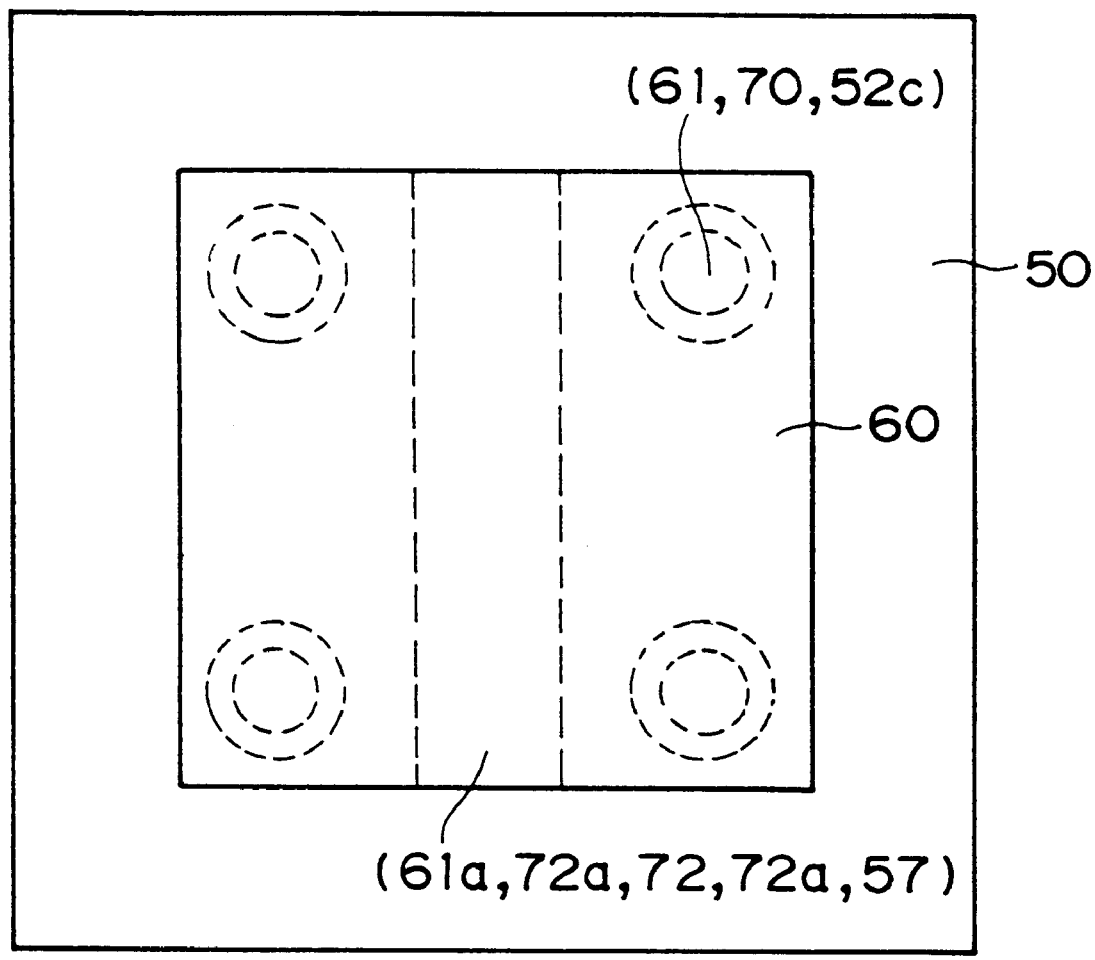
FIG. 47 is a plan view of a composite unit of an optical semiconductor device and a supporting substrate in accordance with the tenth embodiment of this invention.

Referring to FIGS. 46 and 47, reflow equipment is employed to melt the solder bumps (70) and the solder layers (72a). By this process, the electrode patterns (61) and (52c) are caused to be aligned in the horizontal direction by "the self alignment result".

Temperature is gradually decreased, and the optical semiconductor device (60) is depressed down, when the temperature reaches down to approximately 200° C. Since the height of the rectangular base (72) is accurately controlled with respect to the top level of the supporting substrate (50), the height of the optical axis of the optical semiconductor device (60) is made precisely identical to that of an optical fiber to be connected to the optical semiconductor device (60).

Although not shown in the drawings, do not show, the Si substrate (50) is provided with a V-groove produced thereon to receive an optical fiber.

As a result, a good grade of accuracy of 1 μm or less is realized for the mutual geometrical position of the optical semiconductor device (60) and the supporting substrate (50) due to "the self alignment results" in the horizontal direction and to due the precise height of the metal base (72) in the vertical direction.

ELEVENTH EMBODIMENT

A composite unit of an optical semiconductor device and a supporting substrate in accordance with the tenth embodiment, wherein the single rectangular base is replaced by plural disk bases, will now be described.

Figure 48:
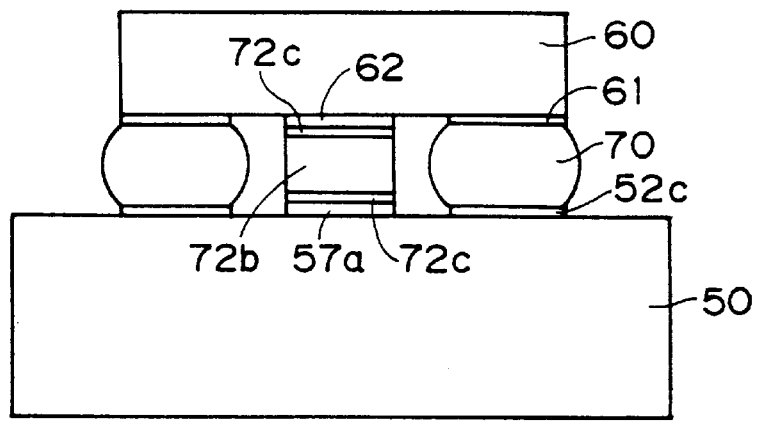
FIG. 48 is a schematic side view of a composite unit of an optical semiconductor device and a supporting substrate in accordance with the eleventh embodiment of this invention.
Figure 49:
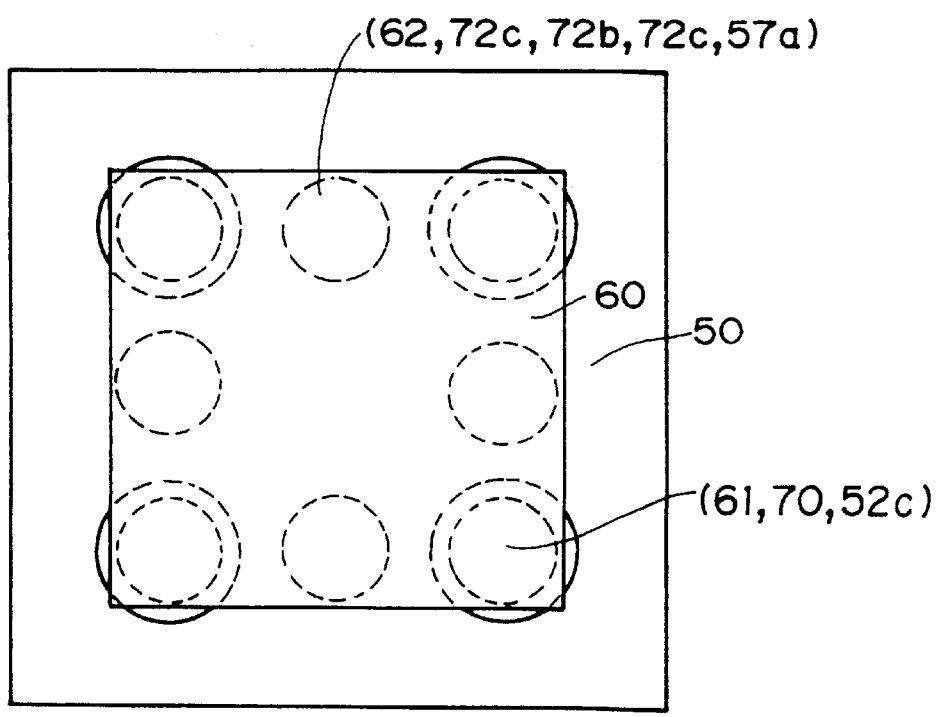
FIG. 49 is a plan view of a composite unit of an optical semiconductor device and a supporting substrate in accordance with the eleventh embodiment of this invention.

Referring to FIGS. 48 and 49, the rectangular spacer (57) and the rectangular base (72) lined by the rectangular solder layers (72a) composing the composite unit of an optical semiconductor device and a supporting substrate in accordance with the tenth embodiment and illustrated in FIGS. 46 and 47 are replaced by four disk spacers (57a) and four disk bases (72b) lined by four disk solder layers (72c). The rectangular spacers (61a) produced on the rear surface of the semiconductor device (60) are replaced by four disk spacers (62) as well. The other elements of the structure, as well as the function and the results, are identical to those of the tenth embodiment.

TWELFTH EMBODIMENT

A composite unit of an optical semiconductor device and a supporting substrate in accordance with the tenth embodiment, wherein the single rectangular base is replaced by a circle made of a wire or a bar having a circular cross section, will now be described.

Figure 50:
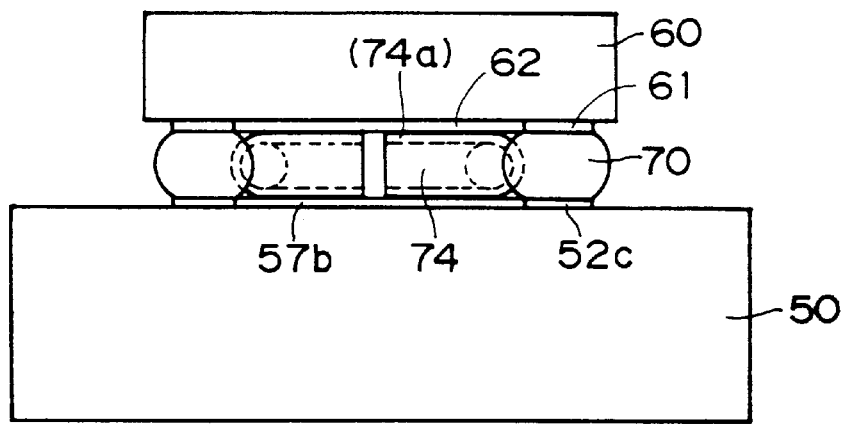
FIG. 50 is a schematic side view of a composite unit of an optical semiconductor device and a supporting substrate in accordance with the twelfth embodiment of this invention.
Figure 51:
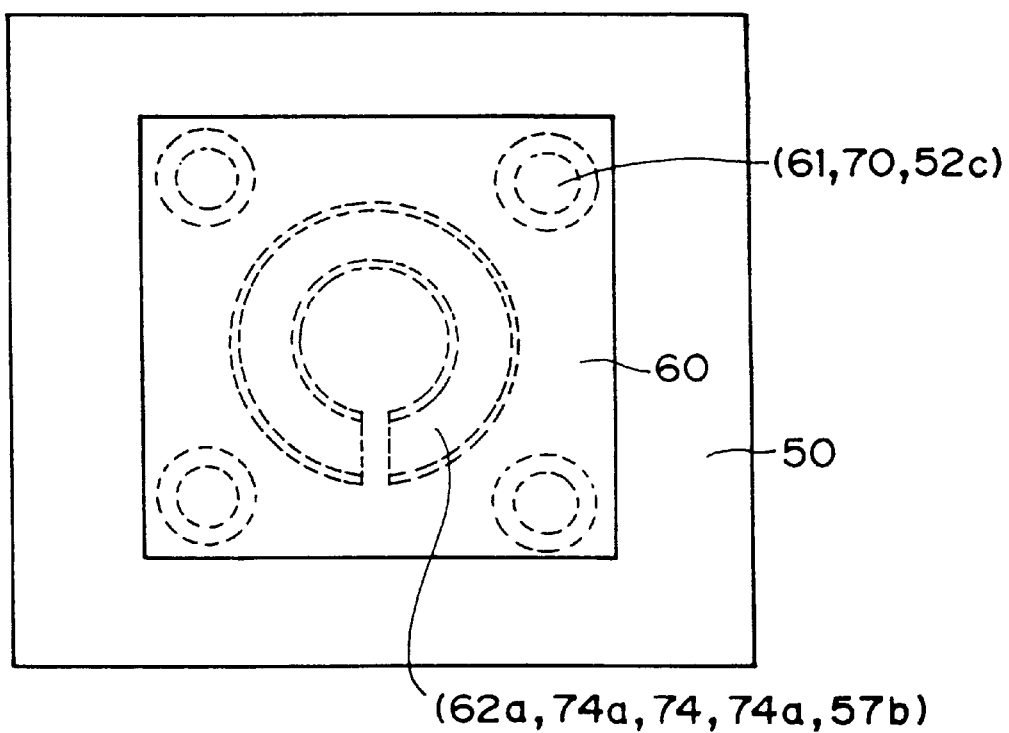
FIG. 51 is plan view of a composite unit of an optical semiconductor device and a supporting substrate in accordance with the twelfth embodiment of this invention.

Referring to FIGS. 50 and 51, the rectangular spacer (57) and the rectangular base (72) lined by the rectangular solder layers (72a) composing the composite unit of an optical semiconductor device and a supporting substrate in accordance with the tenth embodiment and illustrated in FIGS. 46 and 47 are replaced by a spacer having a horizontal shape of a double circle (57b) and a circle (74) having the diameter of approximately 300 μm made of a wire or a bar (74) having a circular cross section whose diameter is approximately 100 μm, the bar having a circular cross section and being lined by a solder layer (74a), or the bar having a circular cross section (74) and being covered by a circular solder layer (74a). The rectangular spacer (61a) produced on the rear surface of the optical semiconductor device (60) is replaced by a spacer having a horizontal shape of a circle (67a), The other elements of the structure, as well as the function and the results, are identical to those of the tenth embodiment.

THIRTEENTH EMBODIMENT

A composite unit of an optical semiconductor device and a supporting substrate in accordance with the twelfth embodiment, wherein the optical semiconductor device lacks a spacer produced on the rear surface thereof, the spacer being employed to be contacted with the circle made of a wire lined by a solder layer, will now be described.

Figure 52:
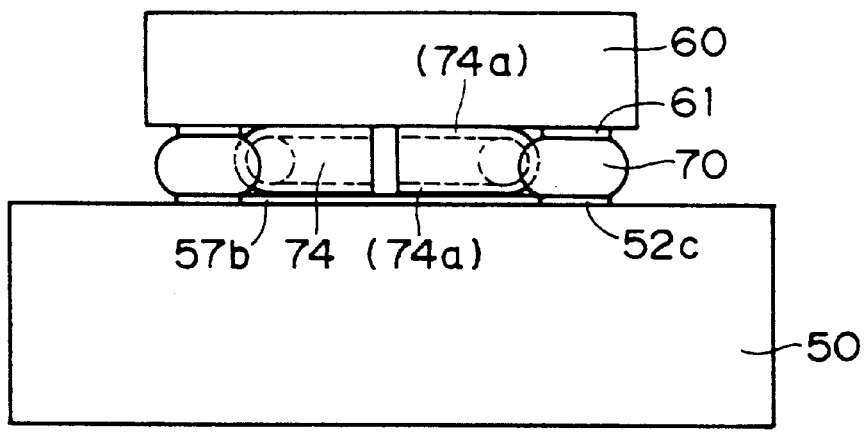
FIG. 52 is schematic side view of a composite unit of an optical semiconductor device and a supporting substrate in accordance with the thirteenth embodiment of this invention.
Figure 53:
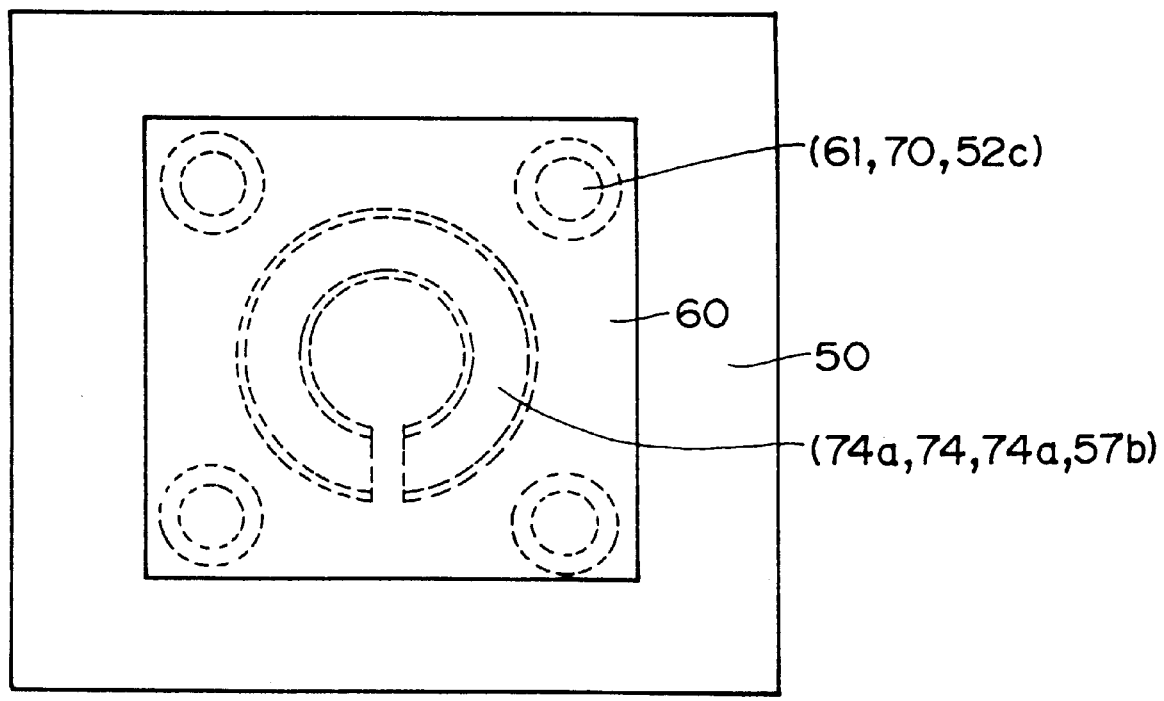
FIG. 53 is plan view of a composite unit of an optical semiconductor device and a supporting substrate in accordance with the thirteenth embodiment of this invention.

Referring to FIGS. 52 and 53, the spacer (62a) produced on the rear surface of the optical semiconductor device (60) is eliminated. In other words, the circle (74) made of a wire lined by a solder layer (74a) directly contacts the rear surface of the optical semiconductor device (60). The other elements of the structure, as well as the function and the results, are identical to those of the tenth embodiment. The composite unit of an optical semiconductor device and a supporting substrate in accordance with this embodiment is scheduled to be employed in the cases where the rear surface of an optical semiconductor device needs not to be connected to the circle (74) made of a wire lined by a solder layer (74a).

FOURTEENTH EMBODIMENT

A composite unit of an optical semiconductor device and a supporting substrate in accordance with the thirteenth embodiment, wherein the optical semiconductor device and the supporting substrate lack spacers produced on the rear surface of the optical semiconductor device and on the top surface of the supporting substrate respectively, will now be described.

Figure 54:
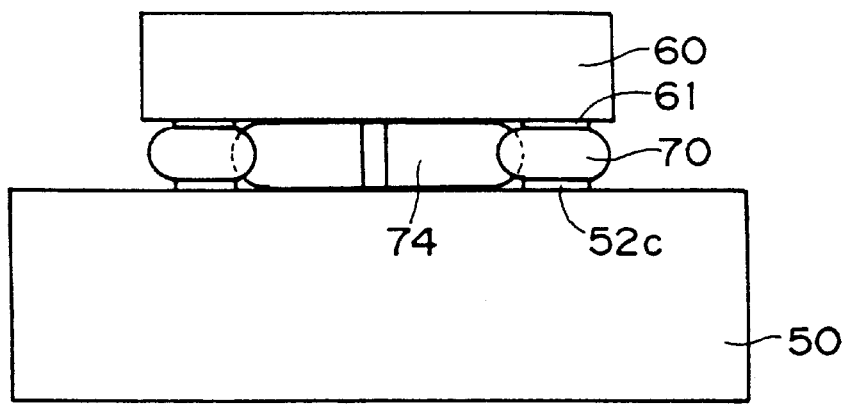
FIG. 54 is schematic side view of a composite unit of an optical semiconductor device and a supporting substrate in accordance with the fourteenth embodiment of this invention.
Figure 55:
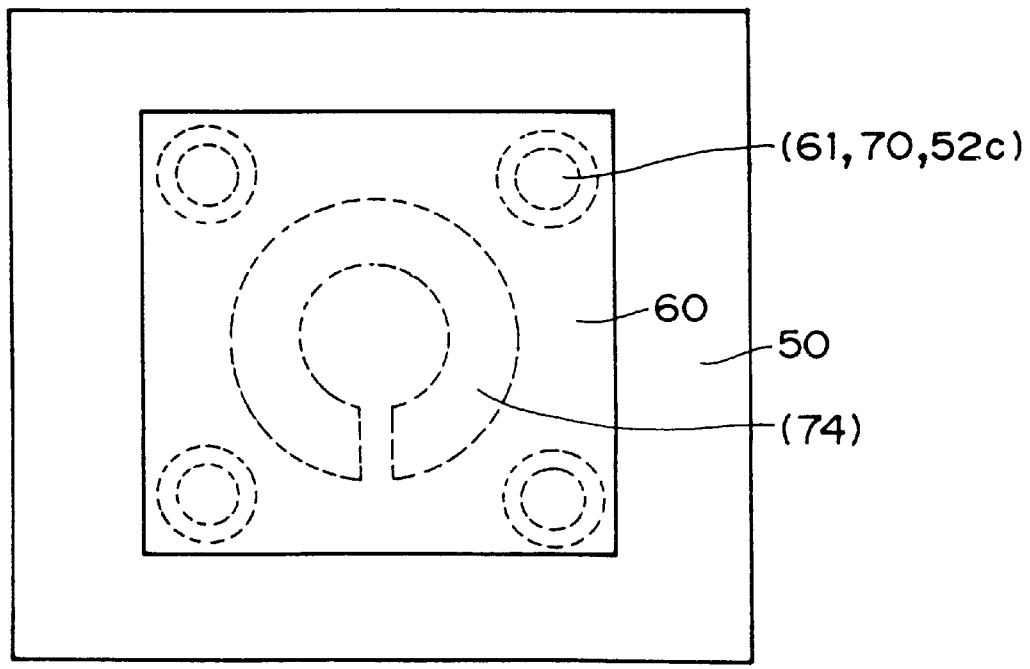
FIG. 55 is plan view of a composite unit of an optical semiconductor device and a supporting substrate in accordance with the fourteenth embodiment of this invention.

Referring to FIGS. 54 and 55, the spacer 62a produced on the rear surface of the optical semiconductor device (60) and the electrode pattern (57b) produced on the supporting substrate (50) are eliminated. The circle (74) made of a wire is not covered by a solder layer (74a). The circle (74) made of a wire and which is not covered by a solder layer (74a) directly contacts the rear surface of the optical semiconductor device (60) and the top surface of the supporting substrate (50). The other elements of the structure, as well as the function and the results, are identical to those of the tenth embodiment. The composite unit of an optical semiconductor device and a supporting substrate in accordance with this embodiment is scheduled to be employed in the cases where the rear surface of an optical semiconductor device needs not to be connected to the circle (74) made of a wire and the top surface of a supporting substrate needs not to be connected to the circle (74) made of a wire.

FIFTEENTH EMBODIMENT

A composite unit of an optical semiconductor device and a supporting substrate, wherein the supporting substrate is provided at least three through-holes penetrating the supporting substrate in the direction perpendicular to the top and rear surfaces of the supporting substrate, electrode patterns each of which has a through-hole produced on the supporting substrate to surround each of the through-holes and solder bumps each of which has a through-hole produced on each of the electrode patterns, and the optical semiconductor device is provided with at least three electrode patterns produced on the rear surface thereof at locations corresponding to the through-holes, whereby each by the electrode patterns of the supporting substrate and each of the solder bumps are connected by making the inside of the through-holes vacuum, and each of the electrode patterns of the optical semiconductor device is accurately aligned each of the electrode patterns of the optical semiconductor device by virtue of "the self alignment results, will now be described".

Figure 56:
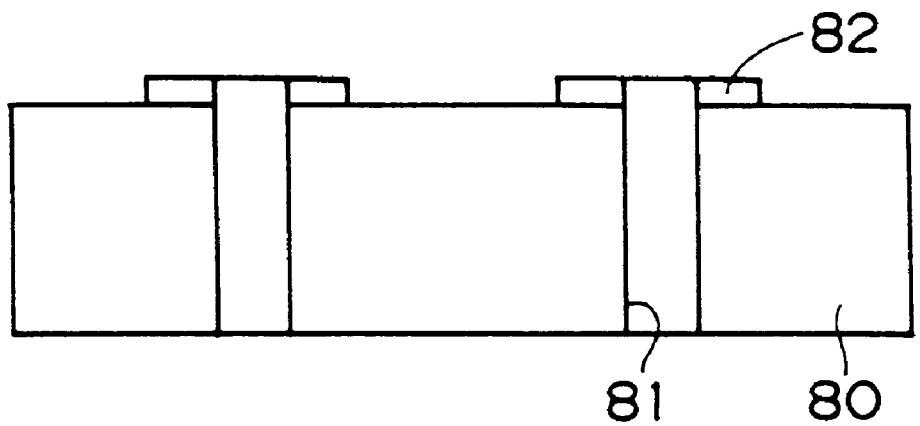
FIG. 56 is a schematic cross sections of a supporting substrate composing a composite unit of an optical semiconductor device and a supporting substrate in accordance with the fifteenth embodiment of this invention, under progress of production.

Referring to FIG. 56, a vacuum evaporation process or a plating process is conducted to produce an Au—Sn layer or a piled layer of Ti/Pt/Au or of Cr/Ni/Au on an Si substrate (80) having an approximate thickness of 1 mm. As electrical discharge machining process is employed to pattern the Au—Sn layer or the piled payer of Ti/Pt/Au or of Cr/Ni/Au, into at least three ring shaped electrode patterns (82) having an approximate diameter of 50 μm. In the drawings, the number of the ring shaped electrode patterns is assumed to be four. An etching process is conducted to produce at least three through-holes (81) each of which is aligned with one of the ring shaped electrode patterns (82).

Figure 57:
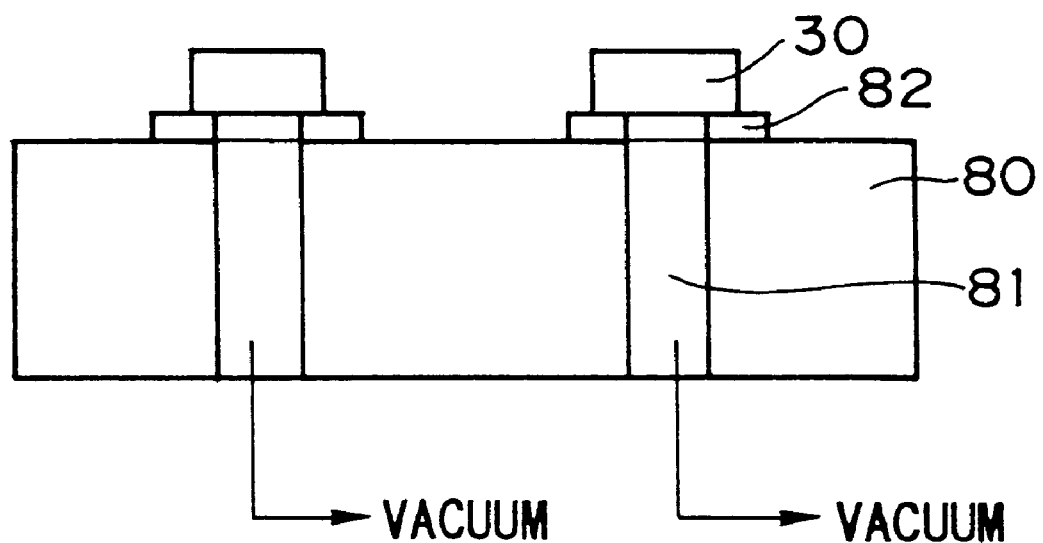
FIG. 57 is a schematic cross sections of a supporting substrate composing a composite unit of an optical semiconductor device and a supporting substrate in accordance with the fifteenth embodiment of this invention, under progress of production.

Referring to FIG. 57, a bump of an Au—Sn solder (30) is placed on each of the ring shaped electrode patterns (82). The bump of an Au—Sn solder (30) is a disk having an approximate thickness of 30 μm. The air confined in each of the through-holes (81) is drawn to vacuum to pull the Au—Sn solder bumps (30) downward toward the ring shaped electrode patterns (82). Since the through-holes (81) and the Au—Sn solder bumps (30) have precisely been produced, the Au—Sn solder bumps (30) are fixed to the ring shaped electrode patterns (82) with an accurate mutual position.

Referring to FIG. 58, after an optical semiconductor device (60) having Au—Sn electrode patterns (61) on the rear surface thereof is placed on the Au—Sn solder bumps (30), a reflow process is conducted to once melt and solidify the Au—Sn solder bumps (30). Due to "the self alignment results", each of the electrode patterns (61) of the optical semiconductor device (60) and each of the ring shaped electrode patterns (82) of the supporting substrate (80) are accurately aligned. In other words, since the surface area of the molten Au—Sn solder lump (30) becomes minimum under a position where the upper and lower electrode patterns (61) and (82) are aligned, each of the electrode patterns (61) of the optical semiconductor device (60) and each of the ring shaped electrode patterns (82) of the supporting substrate (80) are accurately aligned with each other.

As was described above, the mutual geometrical position of the optical semiconductor device (60) and the supporting substrate (80) is accurately regulated by "the self alignment results" in the horizontal direction and by an action to pull the Au—Sn solder bumps (30) toward the supporting substrate (80) employing vacuum in the through-holes in the vertical direction. As a result, the center of the optical axis of the optical semiconductor device can be aligned the center of an optical fiber to be connected the optical semiconductor device. The error is regulated to be 1 μm or less.

Although not shown in the drawings, do not show, the supporting substrate (80) has a V-groove produced along the top surface thereof to receive an optical fiber which is scheduled to be connected with the optical semiconductor device (60).

SIXTEENTH EMBODIMENT

A composite unit of an optical semiconductor device and a supporting substrate, wherein the supporting substrate has two surfaces which are separated by a step having a vertical surface and which are parallel to each other, a lower one of the two top surfaces of the supporting substrate having a rectangular recess of which the longer side is perpendicular to the vertical surface of the step and which has at least two electrode patterns produced therein, and at least two bumps produced on each of the electrode patterns produced in the recess, the higher one of the two surfaces of the supporting substrate having a V-groove for receiving an optical fiber, the V-groove being perpendicular to the vertical surface of the step, and the optical semiconductor device has at least two electrode patterns produced on the rear surface thereof, whereby the optical semiconductor device and the supporting substrate are fixed to each other with a good grade of accuracy by "the self alignment results" realized by once melting and solidifying the solder bumps which intervene between the upper and lower electrode patterns, in the horizontal direction and by the accurate difference in height of the higher and lower surfaces, will now be described.

Figure 59:
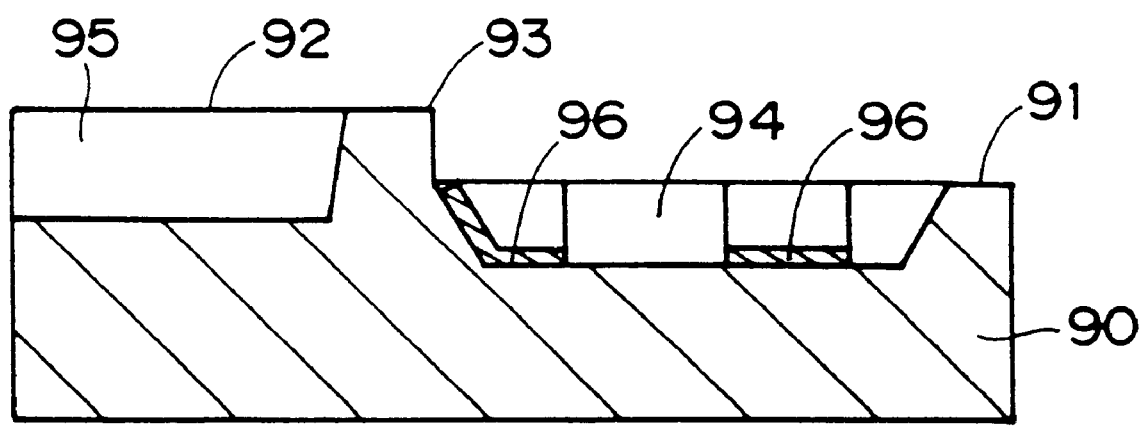
FIG. 59 is a schematic cross section of a supporting substrate composing a composite unit of an optical semiconductor device and a supporting substrate in accordance with the sixteenth embodiment of this invention, under progress of production.
Figure 60:
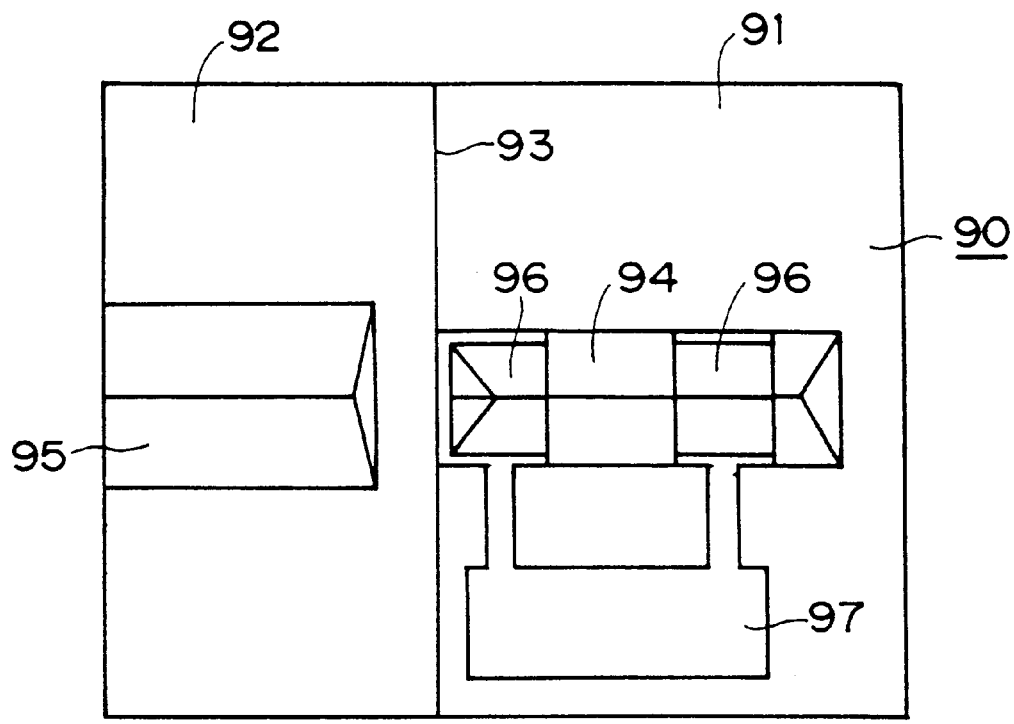
FIG. 60 is a plan view of a supporting substrate composing a composite unit of an optical semiconductor device and a supporting substrate in accordance with the sixteenth embodiment of this invention, under progress of production.

Referring to FIGS. 59 and 60, a part of the top surface of an Si substrate (90) having an approximate thickness of 1 mm is etched to make two surfaces (91) and (92) separated by a step (93) having a vertical surface and which are parallel to each other. An etching process employing an etchant containing KOH is applied to the surface (91) to produce a rectangular recess of which the length is 200 μm, of which the width is 70–110 μm and of which the depth is 50–70 μm and of which the longitudinal side is perpendicular to the vertical side of the step (93), in the Si substrate (90). At least two electrode patterns (96) made of an Au—Sn layer or a piled layer of Ti/Pt/Au or of Cr/Ni/Au (the number of the electrode patterns is two in the drawings) are produced on the bottom surface of the rectangular recess (94). The electrode patterns (96) extend to an electrode (97) produced on the surface (91) (see FIG. 60). An etching process employing an etchant KOH is again applied to the surface (92) to produce a V-groove (95) in the Si substrate (90). The axis of the V-groove (95) which is to receive an optical fiber (not shown) aligns the axis of the rectangular recess (94).

Figure 61:
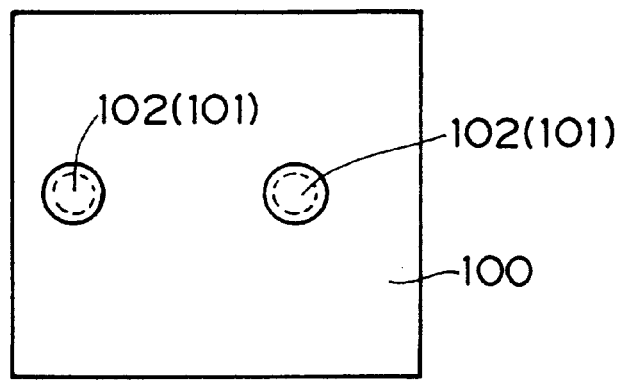
FIG. 61 is a rear view of an optical semiconductor device composing a composite unit of an optical semiconductor device and a supporting substrate in accordance with the sixteenth embodiment of this invention, under progress of production.

Referring to FIG. 61, an optical semiconductor device (a laser diode in this example) (100) is provided with at least two electrode patterns (101) made of an Au—Sn layer or a piled layer of Ti/Pt/Au or of Cr/Ni/Au (the number of the electrode patterns is two in the drawings) on the rear surface thereof. A vacuum evaporation process or a plating process can be employed to produce the electrode patterns (101). An exemplary dimension of a laser diode is 300–350 μm (L), 300–350 μm (W) and 100 μm (H).

On each of the electrode patterns (101), a solder bump (102) made of e.g. an Au—Sn solder containing 80% of Au and 20% of Sn and having a melting temperature of 280° C. is produced. An exemplary height of the solder bump (102) is 60 μm.

Figure 62:
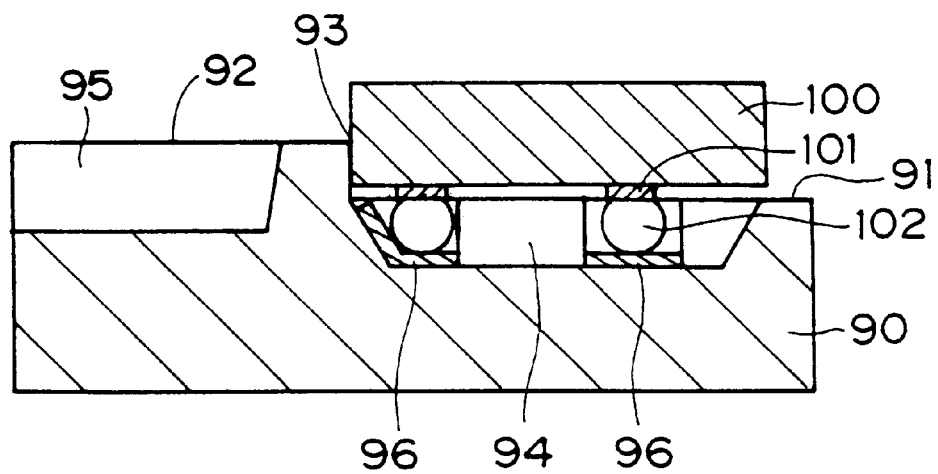
FIG. 62 is a schematic cross section of a composite unit of an optical semiconductor device and a supporting substrate in accordance with the sixteenth embodiment of this invention, under progress of production.

Referring to FIG. 62, an automatic chip mounting machine is employed to place the optical semiconductor device (100) on the supporting substrate (90) in a position to cover the rectangular recess (94) with the optical semiconductor device (100).

Figure 63:
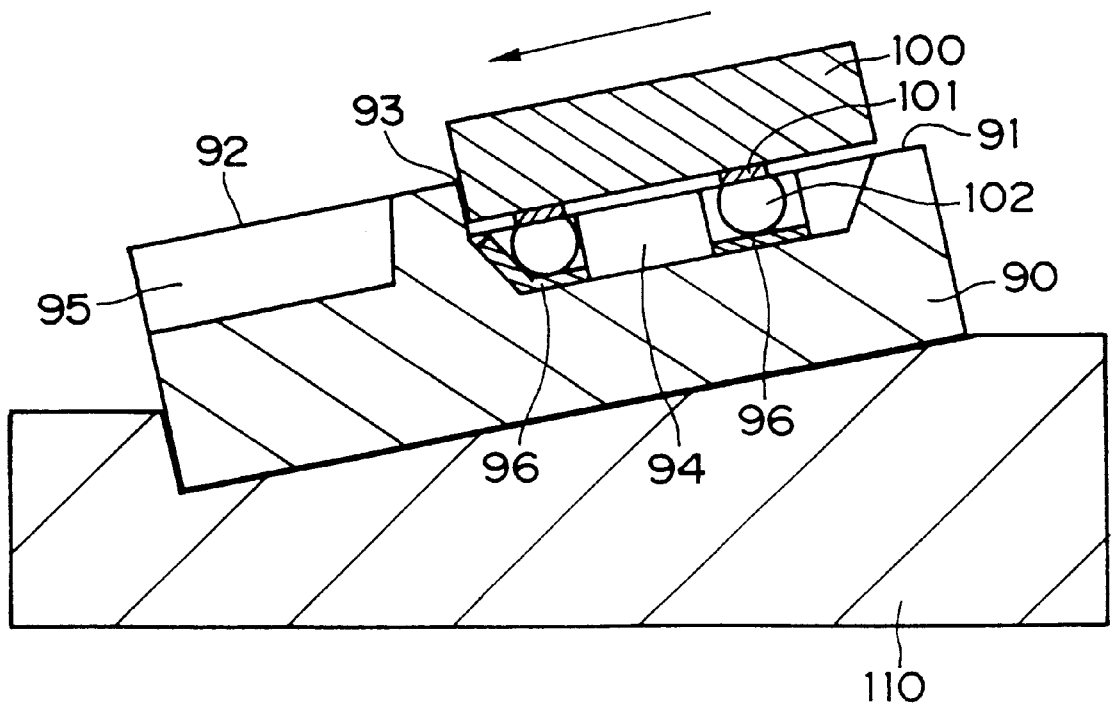
FIG. 63 is a schematic cross section of a composite unit of an optical semiconductor device and a supporting substrate in accordance with the sixteenth embodiment of this invention, under progress of production.

Referring to FIG. 63, the supporting substrate (90) having the optical semiconductor device (100) thereon is placed on an inclined base (110). By the self-weight of the optical semiconductor device (100), it slides toward the step (93) of the supporting substrate (90), in the direction of an arrow illustrated in the drawing. By this process, the optical axis of the optical semiconductor device (100) is caused to be aligned with the optical axis of an optical fiber to be connected the optical semiconductor device (100). Employment of an additional weight is allowed to cause the optical semiconductor device (100) to be urged toward the step (93) along the arrow illustrated in the drawing.

Figure 64:
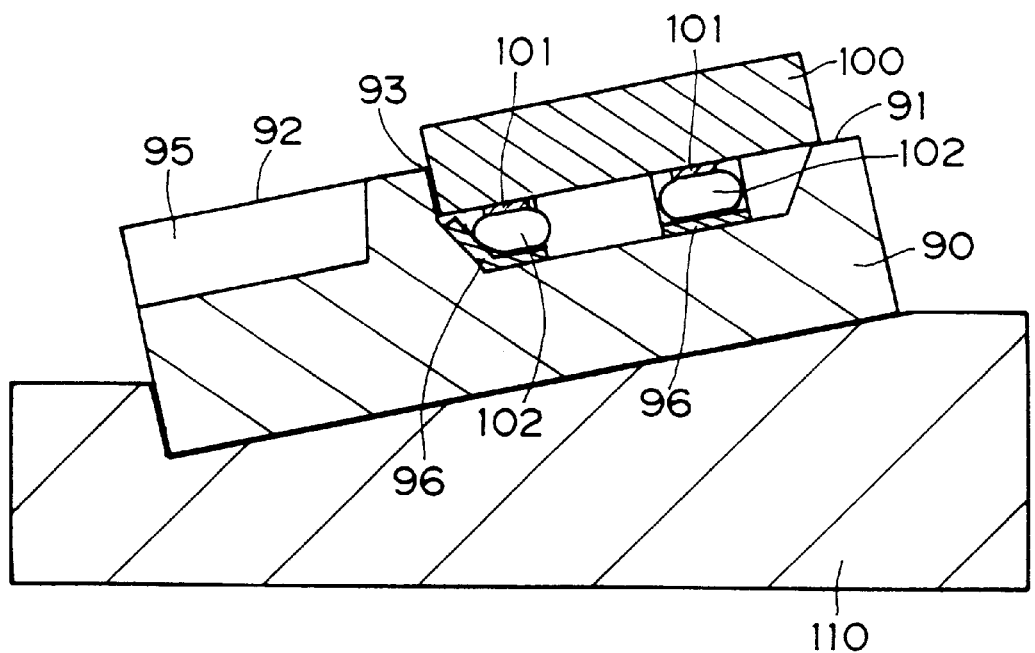
FIG. 64 is a schematic cross section of a in accordance with the sixteenth embodiment of this invention.

Referring to FIG. 64, reflow equipment is employed to heat the supporting substrate (90) attached by the optical semiconductor device (100) to a temperature of e.g. 330° C. As a result, the solder bumps (102) are melted to realize "the self alignment results". In other words, due to surface tension of the molten solder bumps, the optical semiconductor device (100) slides in the horizontal direction to cause the electrode patterns (101) to align with the electrode patterns (96).

Incidentally, the rear surface of the optical semiconductor device (100) is fixed to the top surface of the supporting substrate (90) by the surface-to-surface contact between the rear surface of the optical semiconductor device (100) and the top surface of the supporting substrate (90).

As a result, the optical semiconductor device (100) is mounted on the supporting substrate (90) by the method of this embodiment, in a manner such that the optical axis of the optical semiconductor device (100) is aligned the optical axis of an optical fiber which is connected the optical semiconductor device (100), with an accuracy of 1/μm or less.

SEVENTEENTH EMBODIMENT

A composite unit of an optical semiconductor device and a supporting substrate, wherein the supporting substrate has a rectangular recess which has at least two electrode patterns produced therein and at least two bumps produced on the two electrode patterns produced in the recess, two projections arranged thereon along a line perpendicular to the longitudinal side of the recess, the surfaces of the projections and the surface of the recess being close to each other, and a V-groove for receiving an optical fiber, the center line of the V-groove being aligned the center line of the recess, and the optical semiconductor device has at least two electrode patterns produced on the rear surface thereof, whereby the optical semiconductor device and the supporting substrate are fixed to each other with a good grade of accuracy by "the self alignment results" realized by once melting and solidifying the solder bumps which intervene between the upper and lower electrode patterns, in the horizontal direction and by the accurate difference in height of the higher and lower surfaces, will now be described.

Figure 65:
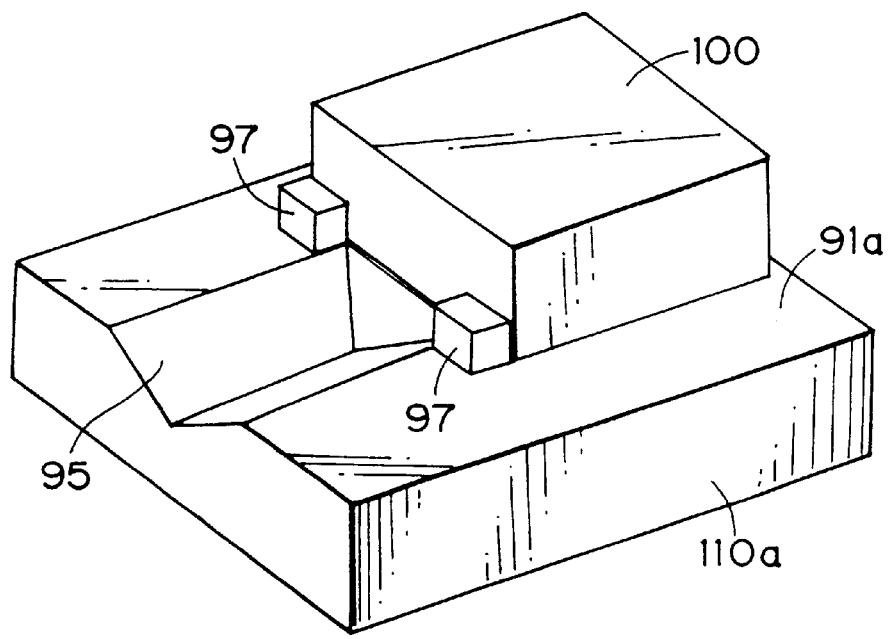
FIG. 65 is a perspective view of a composite unit of an optical semiconductor device and a supporting substrate in accordance with the seventeenth embodiment of this invention.

Referring to FIG. 65, the supporting substrate (110a) of a composite unit of an optical semiconductor device and a supporting substrate in accordance with this embodiment has a single top surface (91a), and the single top surface (91a) is provided with two projections (97) which receives the optical semiconductor device (100) (a laser diode in this example). Although the height of the step (93) separating the two surfaces (91) and (92) of the supporting substrate (90) of the composite unit of an optical semiconductor device and a supporting substrate in accordance with the seventeenth embodiment, is limited to be less than the height of the optical axis of the optical semiconductor device (100), the height of the projections (97) produced on the supporting substrate (110a) of the composite unit of an optical semiconductor device and a supporting substrate in accordance with this embodiment is entirely free.

The other elements of the structure, as well as the function and the results, are identical to those of the seventeenth embodiment.

Since an etching process to be conducted by employing an etchant containing KOH is employed, the shape of the V-groove (95) and the rectangular recess (94) to be produced in the supporting substrate (90) is a V shape. If other etching process such as a dry etching process conducted by employing $CCl_4$, $CF_4$ et al. is employed, the shape of the V-groove (95) and the rectangular recess (94) would become a rectangle. The number of the rectangular recesses in which "a solder bump method" is conducted is not limited to one. If the number of the solder bumps is more than two, the number of the rectangular recesses may be selected to be two or more. It is of course possible to mount a combination of a laser diode connected with an optical fiber in one side and a photo diode connected to the other optical fiber in the other side, the combination of the laser diode and the photo diode being arranged on one single supporting substrate.

The foregoing description has clarified that this invention has successfully provided a variety of composite units of an optical semiconductor device and a supporting substrate, which can readily be assembled with a satisfactory magnitude of accuracy in all the directions without requiring a significant amount of time and labor and a variety of methods for mounting an optical semiconductor device on a supporting substrate, which methods are easy to conduct and of which methods the finished accuracy is entirely satisfactory in all the directions.

Although this invention has been described with reference to specific embodiments, in which e.g. the optical semiconductor device is a laser diode, this description is not meant to be construed in a limiting sense. In other words, an optical semiconductor device assembled in the composite units of an optical semiconductor device and a supporting substrate can be a light emitting diode or a photo diode which usually has the optical axis perpendicular to the layers of an optical semiconductor device. The shape of the recesses produced in the supporting substrate of a composite unit of an optical semiconductor device and a supporting substrate in accordance with the first through sixth embodiments can be a pyramid having a polygon bottom, a cone, a cylinder or a pillar having a square cross section.

The shape of the base of the composite unit of an optical semiconductor device and a supporting substrate in accordance with the tenth or eleventh embodiment is not limited to a rectangle or a circle. The number of the circular bases of the composite unit of an optical semiconductor device and a supporting substrate in accordance with the eleventh embodiment is not limited to four. The base of the composite unit of an optical semiconductor device and a supporting substrate in accordance with the tenth, the eleventh, the twelfth or thirteenth embodiment is not necessarily be plated with a solder. The shape of the base of the composite unit of an optical semiconductor device and a supporting substrate in accordance with the twelfth thirteenth or fourteenth embodiment is not limited to a circular ring. It can be a triangle, a rectangle or an L-shape. The shape of the through-holes of the composite unit of an optical semiconductor device and a supporting substrate in accordance with the fifteenth embodiment is not limited to a circle. It can be a polygon. The solder to be employed to realize "the self alignment results" need not be limited to an Au—Sn solder. The requirements therefor are a large magnitude of surface tension under a molten condition and a large magnitude of conductivity under a solidified condition of the metal. Various modifications of the disclosed embodiments, as well as other embodiments of this invention, will be apparent to persons skilled in the art upon reference to the description of this invention. It is therefore contemplated that the appended claims will cover any such modifications or embodiments as fall within the true scope of this invention.

What is claimed is:

1. A method for mounting an optical semiconductor device on a supporting substrate, comprising the steps of:
   feeding a creamy solder in recesses on the top surface of said supporting substrate,
   scraping away the excess volume of said creamy solder,
   placing electrode patterns produced on the rear surface of said optical semiconductor device on said creamy solder fed in said recess, and
   melting said creamy solder and then solidifying said creamy solder to fix said optical semiconductor device and said supporting substrate.

2. A method for mounting an optical semiconductor device on a supporting substrate in accordance with claim 1, wherein the location of said electrode patterns deviates from the locations of corresponding ones of said recesses.

3. A method for mounting an optical semiconductor device on a supporting substrate, comprising the steps of:
   arranging a solder mass on at least one electrode pattern produced on the top surface of said supporting substrate, on which a base has also been produced,
   placing said optical semiconductor device on said supporting substrate so as to place at least one electrode pattern produced on the rear surface of said optical semiconductor device on a corresponding solder mass,
   melting said solder, and
   depressing said optical semiconductor device until the rear surface of said optical semiconductor device contacts the top surface of said base, said solder then solidifying to fix said optical semiconductor device and said supporting substrate.

4. A method for mounting an optical semiconductor device on a supporting substrate, comprising the steps of:
   arranging solder masses on electrode patterns produced in at least three recesses in said supporting substrate, on which a piled layer of Ti/Pt/Au has also been produced,
   placing said optical semiconductor device on said supporting substrate so as to place at least three electrode patterns produced on said optical semiconductor device on a corresponding solder mass,
   melting said solder, and
   depressing said optical semiconductor device, said solder then solidifying to fix said optical semiconductor device and said supporting substrate.

5. A method for mounting an optical semiconductor device on a supporting substrate, comprising the steps of:
- covering electrode patterns that surround the top ends of a plurality of through-holes that penetrate said supporting substrate with solder bumps,
- drawing out at least some of the air confined in said through-holes,
- placing electrode patterns produced on the rear surface of said optical semiconductor device on said solder bumps, and
- melting and then solidifying said solder bumps.

6. A method for mounting an optical semiconductor device on a supporting substrate, comprising the steps of:
- producing a step separating the top surface of said supporting substrate into two surface portions which have levels that are different from each other and which are parallel to each other, said step having a substantially vertical surface,
- producing a recess extending along the lower surface portion in the direction perpendicular to said step,
- producing at least two electrode patterns on the bottom of said recess,
- producing a bump on each of said electrode patterns,
- producing a recess in the higher surface portion, said recess in the higher surface portion being aligned with said recess in the lower surface portion,
- producing at least two electrode patterns on the rear surface of said optical semiconductor device at locations corresponding to said electrode patterns produced on the bottom of said recess in the lower surface portion,
- placing said electrode patterns produced on the rear surface of said optical semiconductor device on said bumps on said electrode patterns produced in said recess in the lower surface portion,
- urging said optical semiconductor device toward the substantially vertical surface of said step, and
- melting and then solidifying said bumps.

7. A method for mounting an optical semiconductor device on a supporting substrate, comprising the steps of:
- producing a pair of projections on the top surface of said supporting substrate,
- producing a first recess extending along the top surface of said supporting substrate in a direction perpendicular to a line connecting said two projections,
- producing at least two electrode patterns on the bottom of said first recess,
- producing a bump on each of said electrode patterns,
- producing a second recess on the top surface of said supporting substrate, said second recess being aligned with said first recess,
- producing at least two electrode patterns on the rear surface of said optical semiconductor device at locations corresponding to said electrode patterns produced on the bottom of said first recess,
- producing at least two electrode patterns on the rear surface of said optical semiconductor device at locations corresponding to said electrode patterns produced on the bottom of said first recess,
- placing said electrode patterns produced on the rear surface of said optical semiconductor device on said bumps on said electrode patterns produced in said first recess,
- urging said optical semiconductor device toward said pair of projections, and
- melting and then solidifying said bumps.

8. The method for mounting an optical semiconductor device on a supporting substrate in accordance with claim 3, wherein the step of depressing said optical semiconductor device is conducted when the melted solder begins to solidify.

9. The method for mounting an optical semiconductor device on a supporting substrate in accordance with claim 4, wherein the step of depressing said optical semiconductor device is conducted when the melted solder begins to solidify.

10. The method for mounting an optical semiconductor device on a supporting substrate in accordance with claim 6, wherein the step of urging comprises tilting said supporting substrate.

11. The method for mounting an optical semiconductor device on a supporting substrate in accordance with claim 7, wherein the step of urging comprises tilting said supporting substrate.

12. The method for mounting an optical semiconductor device on a supporting substrate in accordance with claim 7, wherein the first recess is a rectangular recess.

13. A method for mounting an optical semiconductor device on a supporting substrate, comprising:
- providing a recess and a groove on a top surface of said supporting substrate, said recess being arranged to positionally correspond to an electrode pattern on a rear surface of said optical semiconductor, and said groove extending from an end of said recess;
- placing a solder bump in said recess;
- melting said solder bump; and
- solidifying said solder bump to fix said optical semiconductor device and said supporting substrate.

14. A method for mounting an optical semiconductor device on a supporting substrate according to claim 13, wherein said recess is provided by removing a portion of said supporting substrate from the top surface of said supporting substrate.

* * * * *